United States Patent
Yamashita

(10) Patent No.: US 11,438,534 B2
(45) Date of Patent: Sep. 6, 2022

(54) SOLID-STATE IMAGING DEVICE AND ELECTRONIC APPARATUS

(71) Applicant: SONY SEMICONDUCTOR SOLUTIONS CORPORATION, Kanagawa (JP)

(72) Inventor: Kazuyoshi Yamashita, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 17/268,813

(22) PCT Filed: Aug. 20, 2019

(86) PCT No.: PCT/JP2019/032399
§ 371 (c)(1),
(2) Date: Feb. 16, 2021

(87) PCT Pub. No.: WO2020/050007
PCT Pub. Date: Mar. 12, 2020

(65) Prior Publication Data
US 2021/0243394 A1   Aug. 5, 2021

(30) Foreign Application Priority Data
Sep. 7, 2018   (JP) .............................. JP2018-167737

(51) Int. Cl.
*H04N 5/355*   (2011.01)
*H04N 5/378*   (2011.01)
(Continued)

(52) U.S. Cl.
CPC ..... *H04N 5/3559* (2013.01); *H01L 27/14612* (2013.01); *H04N 5/343* (2013.01); *H04N 5/378* (2013.01); *H04N 5/3745* (2013.01)

(58) Field of Classification Search
CPC ...... H04N 5/3559; H04N 5/378; H04N 5/343; H04N 5/3745; H04N 5/23229;
(Continued)

(56) References Cited

U.S. PATENT DOCUMENTS

| | | | |
|---|---|---|---|
| 8,284,282 B2 * | 10/2012 | Oike | H04N 5/335 348/294 |
| 8,345,109 B2 * | 1/2013 | Takane | H04N 5/335 348/296 |

(Continued)

FOREIGN PATENT DOCUMENTS

| | | |
|---|---|---|
| JP | 2009-159459 | 7/2009 |
| JP | 2009-268083 | 11/2009 |
| JP | 2011-216673 | 10/2011 |

OTHER PUBLICATIONS

International Search Report prepared by the Japan Patent Office dated Oct. 24, 2019, for International Application No. PCT/JP2019/032399.

*Primary Examiner* — Marly S Camargo
(74) *Attorney, Agent, or Firm* — Sheridan Ross P.C.

(57) ABSTRACT

A solid-state imaging device according to an embodiment of the present disclosure includes a light-receiving surface and a plurality of pixels arranged to face the light-receiving surface. Each of the pixels includes a photoelectric conversion section that photoelectrically converts light incident via the light-receiving surface, a charge-holding section that holds charges transferred from the photoelectric conversion section, a first potential barrier provided between the photoelectric conversion section and the charge-holding section, and a second potential barrier provided around a region including the photoelectric conversion section, the charge-holding section, and a first impurity semiconductor region. The first potential barrier is lower than the second potential barrier.

10 Claims, 25 Drawing Sheets

(51) Int. Cl.
   *H04N 5/374* (2011.01)
   *H04N 5/343* (2011.01)
   *H04N 5/235* (2006.01)
   *H04N 5/353* (2011.01)
   *H01L 27/146* (2006.01)
   *H04N 5/3745* (2011.01)

(58) Field of Classification Search
   CPC .... H04N 5/2353; H04N 5/3532; H04N 5/239; H01L 27/14612; H01L 27/14616; H01L 27/14609; H01L 27/14638; H01L 27/14656
   USPC .... 348/241, 308, 294, 296, 297, 222.1, 299, 348/314, 367; 257/269, 290, 291, 292, 257/293, 443, 444, 445, 450, 475; 250/208.1
   See application file for complete search history.

(56) References Cited

U.S. PATENT DOCUMENTS

| | | | |
|---|---|---|---|
| 2005/0110093 A1* | 5/2005 | Altice | H01L 29/04 257/359 |
| 2009/0167911 A1 | 7/2009 | Takane | |
| 2009/0251582 A1 | 10/2009 | Oike | |
| 2011/0241089 A1 | 10/2011 | Ohri et al. | |
| 2013/0026342 A1* | 1/2013 | McCarten | H01L 27/14603 |
| 2015/0334320 A1* | 11/2015 | Sasaki | H01L 27/14612 348/297 |

* cited by examiner

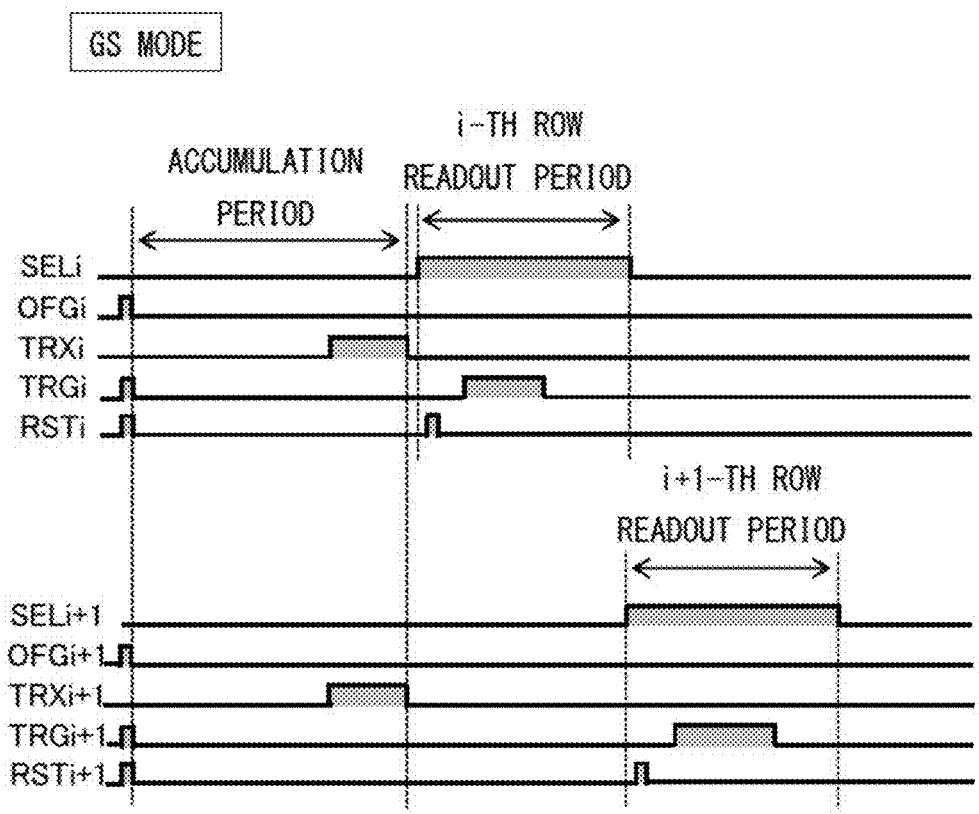

SOLID-STATE IMAGING DEVICE AND ELECTRONIC APPARATUS

CROSS REFERENCE TO RELATED APPLICATIONS

This application is a national stage application under 35 U.S.C. 371 and claims the benefit of PCT Application No. PCT/JP2019/032399 having an international filing date of 20 Aug. 2019, which designated the United States, which PCT application claimed the benefit of Japanese Patent Application No. 2018-167737, filed 7 Sep. 2018, the entire disclosures of each of which are incorporated herein by reference.

TECHNICAL FIELD

The present disclosure relates to a solid-state imaging device and an electronic apparatus.

BACKGROUND ART

The solid-state imaging device has been used for, for example, an imaging apparatus such as a digital still camera or a video camera, or an electronic apparatus such as a portable terminal device having an imaging function. Examples of the solid-state imaging device include a CMOS (complementary MOS) image sensor that reads charges accumulated in a photodiode, which is a photoelectric conversion element, via a MOS (Metal Oxide Semiconductor) transistor (e.g., see PTL 1).

CITATION LIST

Patent Literature

PTL 1: Japanese Unexamined Patent Application Publication No. 2009-268083

SUMMARY OF THE INVENTION

In a case where imaging is performed by a rolling shutter system in a CMOS image sensor, subject distortion called focal plane may occur in some instances. Therefore, it is conceivable to perform imaging by a global shutter system in which charges accumulated by photoelectric conversion in a photodiode are transferred all at once to a charge-holding section and thereafter the charges held in the charge-holding section are sequentially read. However, in such a case, an area of the photodiode becomes smaller, thus causing a dynamic range to be narrower, as compared with the case of the rolling shutter system. Accordingly, there has been an issue of necessity of selecting CMOS image sensors depending on purposes. It is therefore desirable to provide a solid-state imaging device that enables switching between a mode of reducing subject distortion and a mode of obtaining a high dynamic range depending on purposes, and an electronic apparatus including the solid-state imaging device.

A solid-state imaging device according to an embodiment of the present disclosure includes a light-receiving surface and a plurality of pixels arranged to face the light-receiving surface. Each of the pixels includes a photoelectric conversion section that photoelectrically converts light incident via the light-receiving surface, a charge-holding section that holds charges transferred from the photoelectric conversion section, a first potential barrier provided between the photoelectric conversion section and the charge-holding section, and a second potential barrier provided around a region including the photoelectric conversion section, the charge-holding section, and a first impurity semiconductor region. The first potential barrier is lower than the second potential barrier.

An electronic apparatus according to an embodiment of the present disclosure includes a solid-state imaging device that outputs image data corresponding to incident light, and a signal processing circuit that processes the image data. The solid-state imaging device provided in the electronic apparatus has the same configurations as those of the above-described solid-state imaging device.

In the solid-state imaging device and the electronic apparatus according to respective embodiments of the present disclosure, the first potential barrier provided between the photoelectric conversion section and the charge-holding section is lower than the second potential barrier provided around a region including the photoelectric conversion section, the charge-holding section, and the first impurity semiconductor region. This makes it possible, for example, to transfer charges stored in both of the photoelectric conversion section and the charge-holding section to a floating diffusion, or to transfer charges stored in the photoelectric conversion section of each of the pixels all at once to the charge-holding section and thereafter transfer the charges stored in the charge-holding section to the floating diffusion. Here, in a case of storing charges in both of the photoelectric conversion section and the charge-holding section, it is possible to increase a saturated charge amount of each of the pixels as compared with the case of storing charges only in the photoelectric conversion section, thus making it possible to obtain a high dynamic range. In addition, in a case of transferring the charges stored in the photoelectric conversion section of each of the pixels all at once to the charge-holding section, it is possible to reduce subject distortion.

BRIEF DESCRIPTION OF THE DRAWINGS

FIG. 13 illustrates an example of a timing chart in the GS mode.

MODES FOR CARRYING OUT THE INVENTION

Figure 34:
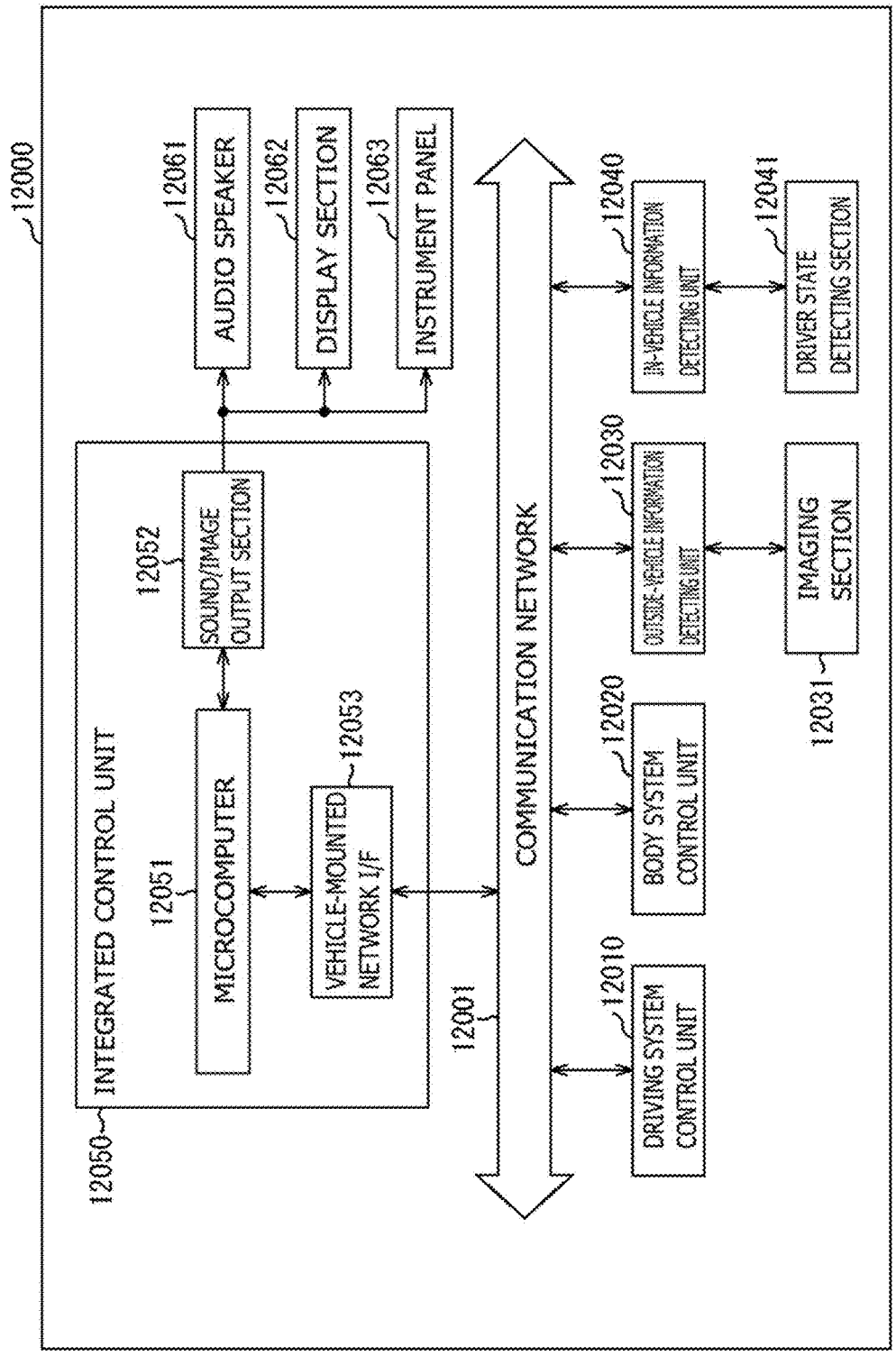
FIG. 34 is a block diagram depicting an example of schematic configuration of a vehicle control system.
Figure 35:
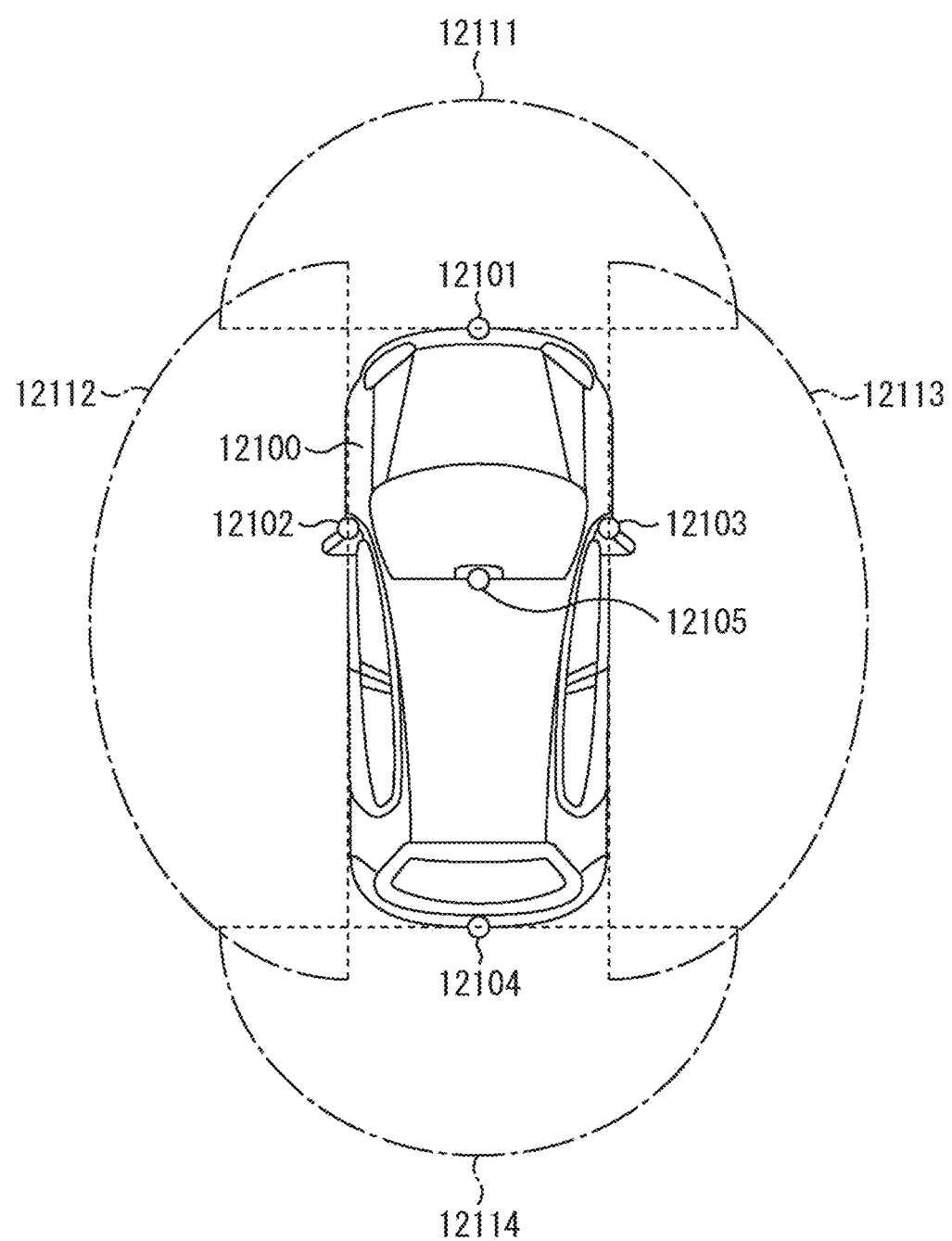
FIG. 35 is a diagram of assistance in explaining an example of installation positions of an outside-vehicle information detecting section and an imaging section.

Hereinafter, description is given in detail of embodiments of the present disclosure with reference to the drawings. It is to be noted that description is given in the following order.
1. Embodiment (Solid-State Imaging Device) . . . FIGS. 1 to 13
2. Modification Example (Solid-State Imaging Device) . . . FIGS. 14 to 30
3. Example of Application (Imaging System) . . . FIGS. 31 to 33
4. Example of Practical Application to Mobile Body . . . FIGS. 34 and 35

1. Embodiment

[Configuration]

Description is given of a solid-state imaging device 1 according to an embodiment of the present disclosure. The solid-state imaging device 1 is, for example, a topside illumination type image sensor including a CMOS (Complementary Metal Oxide Semiconductor) image sensor, or the like. The solid-state imaging device 1 receives light from a subject and performs photoelectric conversion to generate a pixel signal, thereby capturing an image. The solid-state imaging device 1 outputs a pixel signal corresponding to incident light.

The topside illumination type image sensor refers to an image sensor of a configuration in which a photoelectric conversion section such as a photodiode that receives light from a subject and converts the received light into an electric signal is provided between a light-receiving surface on which light from the subject is incident and a back surface of a semiconductor substrate. It is to be noted that the present disclosure is not limited to application to the CMOS image sensor.

Figure 1:
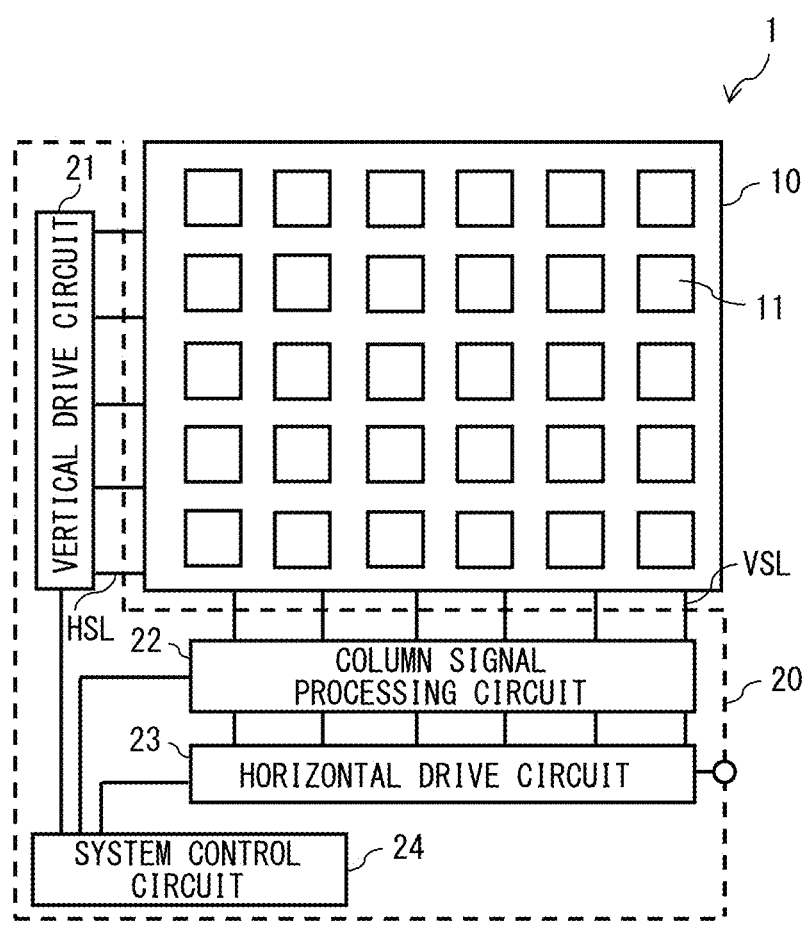
FIG. 1 illustrates an example of a schematic configuration of a solid-state imaging device according to an embodiment of the present disclosure.

FIG. 1 illustrates an example of a schematic configuration of the solid-state imaging device 1 according to an embodiment of the present disclosure. The solid-state imaging device 1 includes a pixel array section 10 and a logic circuit 20. The pixel array section 10 includes a plurality of sensor pixels 11 and a plurality of readout circuits 12 (described later). The sensor pixel 11 corresponds to a specific example of a "pixel" of the present disclosure. Each of the sensor pixels 11 performs photoelectric conversion to output charges corresponding to an amount of light reception. The plurality of sensor pixels 11 are each disposed to face a light-receiving surface 10A (described later), and are arranged in matrix in the pixel array section 10. Each of the readout circuits 12 outputs a pixel signal based on the charges outputted from the sensor pixel 11. The plurality of readout circuits 12 are provided one by one for the respective sensor pixels 11, for example, in the pixel array section 10. It is to be noted that each of the plurality of readout circuits 12 may be provided for a plurality of sensor pixels 11 in the pixel array section 10.

The pixel array section 10 includes a plurality of pixel drive lines HSL and a plurality of data output lines VSL. The pixel drive line HSL is a wiring line to which a control signal is applied that controls an output of charges accumulated in the sensor pixel 11, and extends in a row direction, for example. The data output line VSL is a wiring line that outputs a pixel signal outputted from each readout circuit 12 to the logic circuit 20, and extends in a column direction, for example.

The logic circuit 20 includes, for example, a vertical drive circuit 21, a column signal processing circuit 22, a horizontal drive circuit 23, and a system control circuit 24. The logic circuit 20 (specifically, the horizontal drive circuit 23) outputs an output voltage of each sensor pixel 11 to an external apparatus to thereby provide image data to the external apparatus.

The vertical drive circuit 21 sequentially selects, for example, a plurality of sensor pixels 11 for each predetermined unit pixel row. The "predetermined unit pixel row" refers to a pixel row from which pixels are selectable at the same address. For example, in a case where one sensor pixel 11 is assigned to one readout circuit 12, the "predetermined unit pixel row" refers to one pixel row. In addition, for example, in a case where the plurality of sensor pixels 11 share one readout circuit 12, when a layout of the plurality of sensor pixels 11 sharing the readout circuit 12 corresponds to two pixel rows×n pixel columns (n is an integer of one or more), the "predetermined unit pixel row" refers to two pixel rows. Likewise, when a layout of the plurality of sensor pixels 11 sharing the readout circuit 12 corresponds to four pixel rows×n pixel columns (n is an integer of one or more), the "predetermined unit pixel row" refers to four pixel rows. The vertical drive circuit 21 controls transistors (e.g., a first transfer transistor TRX, a second transfer transistor TRG, and a discharge transistor OFG) in each sensor pixel 11 via the pixel drive line HSL, and further controls transistors (e.g., a reset transistor RST and a selection transistor SEL) in each readout circuit 12.

The column signal processing circuit 22 performs correlated double sampling (Correlated Double Sampling: CDS) processing, for example, on a pixel signal outputted from each sensor pixel 11 of a row selected by the vertical drive circuit 21. The column signal processing circuit 22 performs the CDS processing, for example, to thereby extract a signal level of the pixel signal, and holds pixel data corresponding to an amount of light received by each sensor pixel 11. The column signal processing circuit 22 includes a column signal processing section for each data output line VSL, for example. The column signal processing section includes, for example, a single slope A/D converter. The single slope A/D converter includes, for example, a comparator and a counter circuit. The horizontal drive circuit 23 sequentially outputs pixel data held in the column signal processing circuit 22, for example, to the outside. The system control circuit 24 controls driving of each of blocks (vertical drive circuit 21, column signal processing circuit 22, and horizontal drive circuit 23) in the logic circuit 20, for example.

Figure 2:
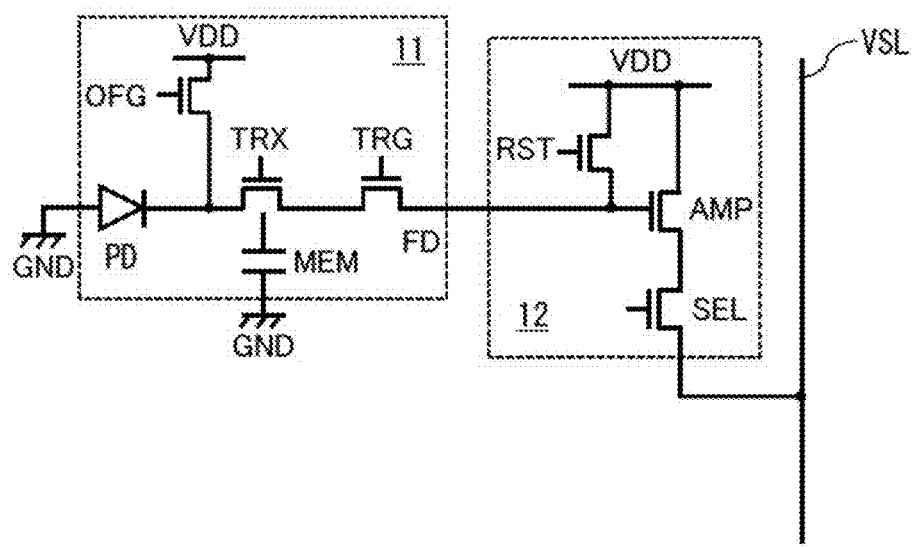
FIG. 2 illustrates an example of a circuit configuration of a sensor pixel and a readout circuit of FIG. 1.

FIG. 2 illustrates an example of circuit configurations of the sensor pixel 11 and the readout circuit 12. FIG. 2 exemplifies a case where one sensor pixel 11 is assigned to one readout circuit 12. Each sensor pixel 11 includes mutually common components. Each sensor pixel 11 includes, for example, a photodiode PD, a first transfer transistor TRX, a second transfer transistor TRG, a charge-holding section MEM, a floating diffusion FD, a discharge transistor OFG, and a discharge floating diffusion OFD. The first transfer transistor TRX, the second transfer transistor TRG, and the discharge transistor OFG are each, for example, an NMOS (Metal Oxide Semiconductor) transistor. The photodiode PD corresponds to a specific example of a "photoelectric conversion section" of the present disclosure.

The photodiode PD photoelectrically converts light incident via the light-receiving surface 10A (described later). The photodiode PD performs photoelectric conversion to generate charges corresponding to an amount of light reception. The photodiode PD is, for example, a photoelectric conversion element of PN-junction type. A cathode of the photodiode PD is electrically coupled to a source of the first transfer transistor TRX, and an anode of the photodiode PD is electrically coupled to a reference potential line (e.g., ground GND).

The first transfer transistor TRX is coupled between the photodiode PD and the second transfer transistor TRG, and controls a potential of the charge-holding section MEM in response to a control signal applied to a gate of the first transfer transistor TRX. For example, when the first transfer transistor TRX is turned ON, the potential of the charge-holding section MEM is deepened. In addition, when the first transfer transistor TRX is turned OFF, the potential of the charge-holding section MEM is shallowed. When the first transfer transistor TRX is turned ON, charges accumulated in the photodiode PD are transferred to the charge-holding section MEM via the first transfer transistor TRX. A drain of the first transfer transistor TRX is electrically coupled to a source of the second transfer transistor TRG, and the gate of the first transfer transistor TRX is coupled to the pixel drive line HSL.

The first transfer transistor TRX further controls a height (potential $\varphi_X$) of a first potential barrier 40 (see FIG. 5) described later in response to a control signal applied to the gate of the first transfer transistor TRX. For example, when the first transfer transistor TRX is turned ON, the height (potential $\varphi_X$) of the first potential barrier 40 is deepened. In addition, for example, in a case where the first transfer transistor TRX is turned OFF, when a negative bias is applied to the gate of the first transfer transistor TRX, the height of the first potential barrier 40 (potential $\varphi_X$) becomes shallower as compared with a time when no negative bias is applied to the gate of the first transfer transistor TRX. At this time, a difference between the height (potential $\varphi_X$) of the first potential barrier 40 and each of heights (potentials $\varphi_{TRG}$ and $\varphi_{OFG}$) of a second potential barrier 50 (described later) is narrowed as compared with a difference at the time when no negative bias is applied to the gate of the first transfer transistor TRX.

The charge-holding section MEM is a region where the charges accumulated in the photodiode PD are temporarily held. The charge-holding section MEM holds charges transferred from the photodiode PD.

The second transfer transistor TRG is coupled between the first transfer transistor TRX and the floating diffusion FD, and transfers the charges held in the charge-holding section MEM to the floating diffusion FD in response to a control signal applied to a gate of the second transfer transistor TRG. For example, when the first transfer transistor TRX is turned OFF and the second transfer transistor TRG is turned ON, the charges held in the charge-holding section MEM are transferred to the floating diffusion FD via the second transfer transistor TRG. A drain of the second transfer transistor TRG is electrically coupled to the floating diffusion FD, and the gate of the second transfer transistor TRG is coupled to the pixel drive line HSL.

The floating diffusion FD is a floating diffusion region where the charges outputted from the photodiode PD via the first transfer transistor TRX and the second transfer transistor TRG are temporarily held. For example, the reset transistor RST is coupled to the floating diffusion FD, and the vertical signal line VSL is coupled to the floating diffusion FD via an amplification transistor AMP and the selection transistor SEL.

The discharge transistor OFG is coupled between the photodiode PD and a power source line VDD, and initializes (resets) the photodiode PD in response to a control signal applied to a gate of the discharge transistor OFG. For example, when the discharge transistor OFG is turned ON, an electric potential of the photodiode PD is reset to an electric potential level of the power source line VDD. That is, initialization of the photodiode PD is performed. In addition, the discharge transistor OFG forms an overflow path, for example, between the first transfer transistor TRX and the power source line VDD, and discharges charges overflowed from the photodiode PD to the power source line VDD. A drain of the discharge transistor OFG is coupled to the power source line VDD; a source of the discharge transistor OFG is coupled between the photodiode PD and the first transfer transistor TRX; and the gate of the discharge transistor OFG is coupled to the pixel drive line HSL.

The reset transistor RST is coupled between the floating diffusion FD and the power source line VDD, and initializes (resets) each of regions from the charge-holding section MEM to the floating diffusion FD in response to a control signal applied to a gate of the reset transistor RST. For example, when the second transfer transistor TRG and the reset transistor RST are turned ON, electric potentials of the charge-holding section MEM and the floating diffusion FD are reset to the electric potential level of the power source line VDD. That is, the charge-holding section MEM and the floating diffusion FD are initialized. A drain of the reset transistor RST is coupled to the power source line VDD; a source of the reset transistor RST is coupled to the floating diffusion FD; and the gate of the reset transistor RST is coupled to the pixel drive line HSL.

In the amplification transistor AMP, a gate is coupled to the floating diffusion FD; a drain is coupled to the power source line VDD; and a source is coupled to a drain of the selection transistor SEL. The amplification transistor AMP serves as an input section of a source follower circuit that reads charges obtained by photoelectric conversion in the photodiode PD. The source of the amplification transistor AMP is coupled to the vertical signal line VSL via the selection transistor SEL, and thus the amplification transistor AMP configures a source follower circuit with a constant-current source coupled to one end of the vertical signal line VSL. The amplification transistor AMP converts charges obtained by photoelectric conversion in the photodiode PD into a pixel signal, and outputs the converted pixel signal to the vertical signal line VSL via the selection transistor SEL.

In the selection transistor SEL, the drain is coupled to the source of the amplification transistor AMP; a source is coupled to the vertical signal line VSL; and a gate is coupled to the pixel drive line HSL. The selection transistor SEL controls the output of the pixel signal outputted from the amplification transistor AMP to the vertical signal line VSL in response to a control signal applied to the gate of the selection transistor SEL. When the control signal is turned ON, the selection transistor SEL is brought into a conductive state, and the sensor pixel 11 linked to the selection transistor SEL is brought into a selected state. When the sensor pixel 11 is brought into the selected state, the pixel signal outputted from the amplification transistor AMP is read by the column signal processing circuit 22 via the vertical signal line VSL.

Figure 3:
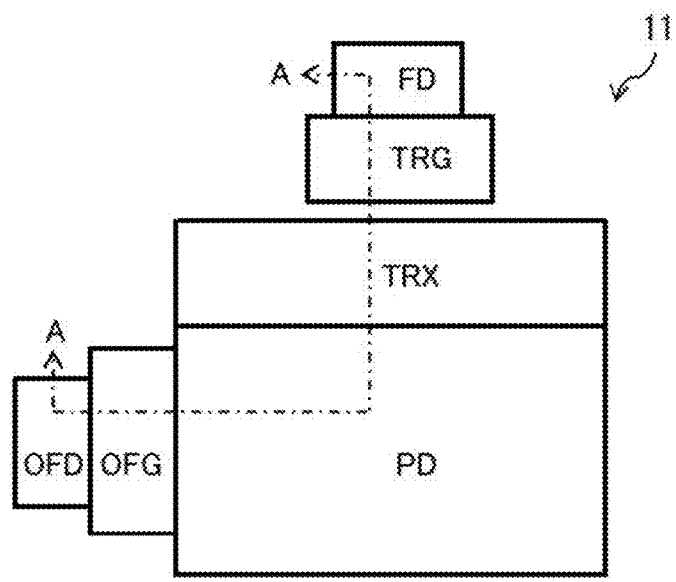
FIG. 3 illustrates an example of a planar configuration of the sensor pixel of FIG. 1.
Figure 4:
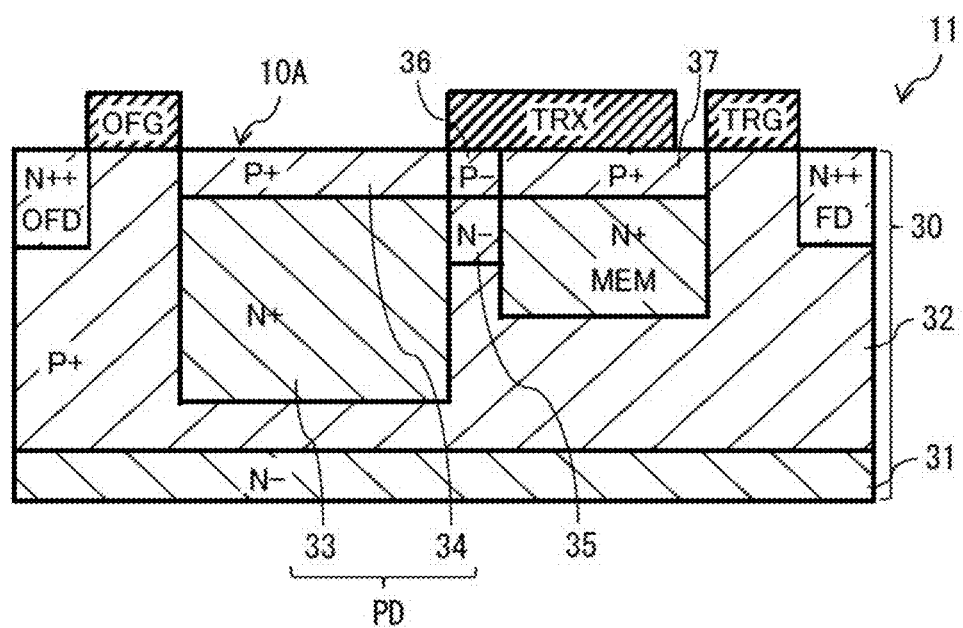
FIG. 4 illustrates an example of a cross-sectional configuration along a line A-A of FIG. 1.
Figure 5:
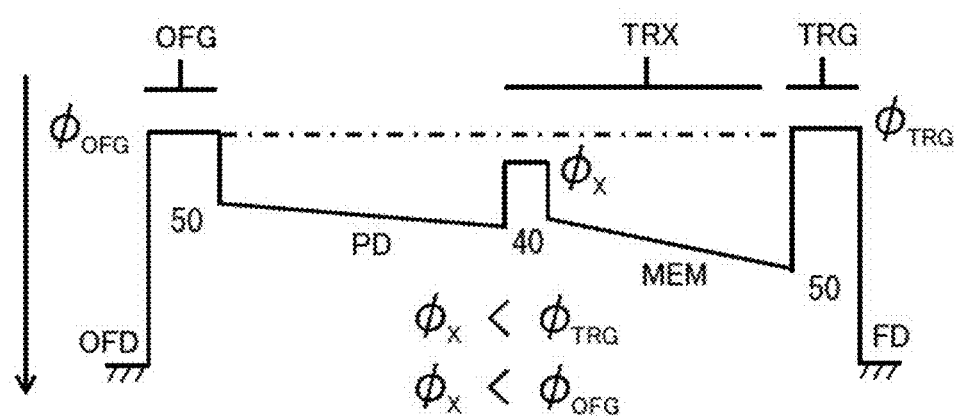
FIG. 5 illustrates an example of a one-dimensional potential along the line A-A of FIG. 3.

Next, description is given in detail of a configuration of the sensor pixel 11. FIG. 3 illustrates an example of a planar configuration of the sensor pixel 11. FIG. 4 illustrates an example of a cross-sectional configuration along a line A-A of FIG. 3. FIG. 5 illustrates an example of a one-dimensional potential along the line A-A of FIG. 3. FIGS. 3 to 5 are each a schematic diagram and are not necessarily precisely illustrated. In FIG. 4, the density of an impurity concentration is indicated by representations such as "P+", "P−", "N−", "N+", and "N++." As used herein, "P+" indicates a higher concentration of p-type impurities (acceptors) than that of "P−". At a location denoted as "P−", for example, a concentration of the p-type impurities (acceptors) is a value within a range from $1 \times 10^{16}$ $cm^{-3}$ to $5 \times 10^{18}$ $cm^{-3}$. 'N+' indicates a higher concentration of n-type impurities (donors) than that of 'N−'. 'N++' indicates a higher concentration of the n-type impurities (donors) than that of 'N+'. At a location denoted as "N−", for example, the concentration of the n-type impurities (donors) is a value within a range from $1 \times 10^{16}$ $cm^{-3}$ to $5 \times 10^{18}$ $cm^{-3}$.

The sensor pixel 11 is formed on a semiconductor substrate 30. The semiconductor substrate 30 is, for example, a silicon substrate. The semiconductor substrate 30 includes a p-well layer 32 on and near an upper surface of the semiconductor substrate 30, and includes an n-type semiconductor layer 31 at a location deeper than the p-well layer 32. The p-well layer 32 is a p-type semiconductor region formed on and near the upper surface of the semiconductor substrate 30. An n-type semiconductor region 33 and a p-type semiconductor region 34 are formed in the p-well layer 32. The p-type semiconductor region 34 is formed on the upper surface of the semiconductor substrate 30, and is in contact with the n-type semiconductor region 33. The n-type semiconductor region 33 and the p-type semiconductor region 34 are stacked in a thickness direction (normal direction) of the semiconductor substrate 30, and configure the photodiode PD. Of the upper surface of the semiconductor substrate 30, a region where the p-type semiconductor region 34 is formed serves as the light-receiving surface 10A.

The charge-holding section MEM is formed at a location, of the p-well layer 32, opposed to the gate of the first transfer transistor TRX. The charge-holding section MEM is formed at a predetermined depth from the upper surface of the semiconductor substrate 30. The charge-holding section MEM is configured by a semiconductor region of the n-type impurities formed in the p-well layer 32. A p-type semiconductor region 37 is formed between the upper surface of the semiconductor substrate 30 and the charge-holding section MEM.

The first potential barrier 40 is formed between the photodiode PD and the charge-holding section MEM in the p-well layer 32. That is, the sensor pixel 11 is provided with the first potential barrier 40 between the photodiode PD and the charge-holding section MEM. The first potential barrier 40 is formed by a p-type semiconductor region 36 and an n-type semiconductor region 35 that are formed between the photodiode PD and the charge-holding section MEM. The p-type semiconductor region 36 is formed on the upper surface of the semiconductor substrate 30, and is formed between the p-type semiconductor region 34 and the p-type semiconductor region 37. The p-type semiconductor region 36 is formed at a location facing the first transfer transistor TRX. The height (potential $\varphi_X$) of the first potential barrier 40 is lower than the heights (potentials $\varphi_{TRG}$ and $\varphi_{OFG}$) of the second potential barrier 50 described later. A concentration of the p-type impurities (acceptors) of the p-type semiconductor region 36 is lower than concentrations of the p-type impurities (acceptors) of the p-well layer 32, the p-type semiconductor region 34, and the p-type semiconductor region 37. The n-type semiconductor region 35 is formed directly below the p-type semiconductor region 36, and is formed between the n-type semiconductor region 33 and the charge-holding section MEM. The n-type semiconductor region 35 is formed at a position opposed to the first transfer transistor TRX. A concentration of the n-type impurities (donors) of the n-type semiconductor region 35 is lower than concentrations of the n-type impurities (donors) of the n-type semiconductor region 33 and the charge-holding section MEM.

The second potential barrier 50 is formed around a region including the photodiode PD, the charge-holding section MEM, and the first potential barrier 40. That is, the sensor pixel 11 is provided with the second potential barrier 50 around the region including the charge-holding section MEM and the first potential barrier 40. The second potential barrier 50 is formed by the p-well layer 32 formed around the region including the charge-holding section MEM and the first potential barrier 40. The potential $\varphi_{TRG}$ at a location, of the p-well layer 32, facing the gate of the second transfer transistor TRG and the potential $\varphi_{OFG}$ at a location, of the p-well layer 32, facing the discharge transistor OFG are higher than the potential $\varphi_X$ of the p-type semiconductor region 36. The potential $\varphi_{TRG}$ and the potential $\varphi_{OFG}$ may be equal to each other or may be different from each other.

The floating diffusion FD and the discharge floating diffusion OFD are formed around the second potential barrier 50. That is, the sensor pixel 11 is provided with the floating diffusion FD and the discharge floating diffusion OFD around the second potential barrier 50. The floating diffusion FD and the discharge floating diffusion OFD are both configured by a semiconductor region having a high concentration of the n-type impurities formed in the p-well layer 32.

[Imaging Mode]

Next, description is given of an imaging mode of the solid-state imaging device 1 according to the present embodiment.

In accordance with an imaging command from an operation unit 250 described later, for example, the solid-state imaging device 1 (specifically, the system control circuit 24) selects an imaging mode, and executes an operation corresponding to the selected imaging mode. Examples of the imaging command include an imaging command in a DR (Dynamic Range) expansion mode and an imaging command in a GS (Global Shutter) mode. The DR expansion mode corresponds to a specific example of a "first imaging mode" of the present disclosure. The GS mode corresponds to a specific example of a "second imaging mode" of the present disclosure. The DR expansion mode is an imaging mode suitable for imaging in a bright environment such as the outdoors, for example, and the imaging command in the DR expansion mode is an imaging command in a rolling shutter system. The GS mode is an imaging mode suitable for continuous imaging of a subject with motion (imaging of a moving image) such as a game of soccer, for example, and the imaging command in the GS mode is an imaging command in a global shutter system. In this manner, the solid-state imaging device 1 (specifically, the system control circuit 24) is available to a plurality of imaging systems (the rolling shutter system and the global shutter system).

Figure 6:
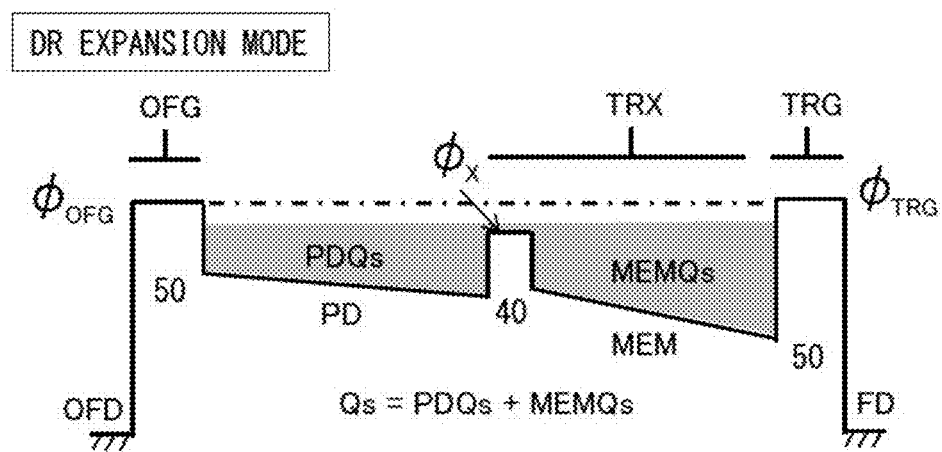
FIG. 6 illustrates an example of a one-dimensional potential in a DR expansion mode.
Figure 7:
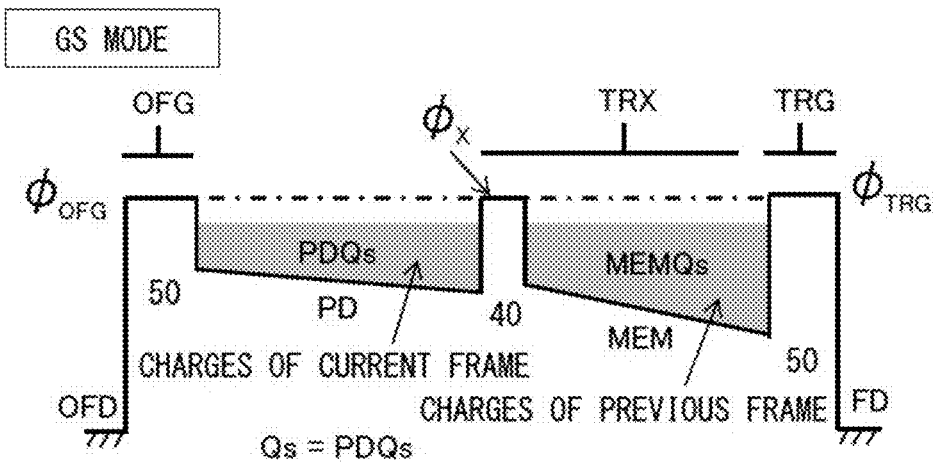
FIG. 7 illustrates an example of a one-dimensional potential in a GS mode.
Figure 8:
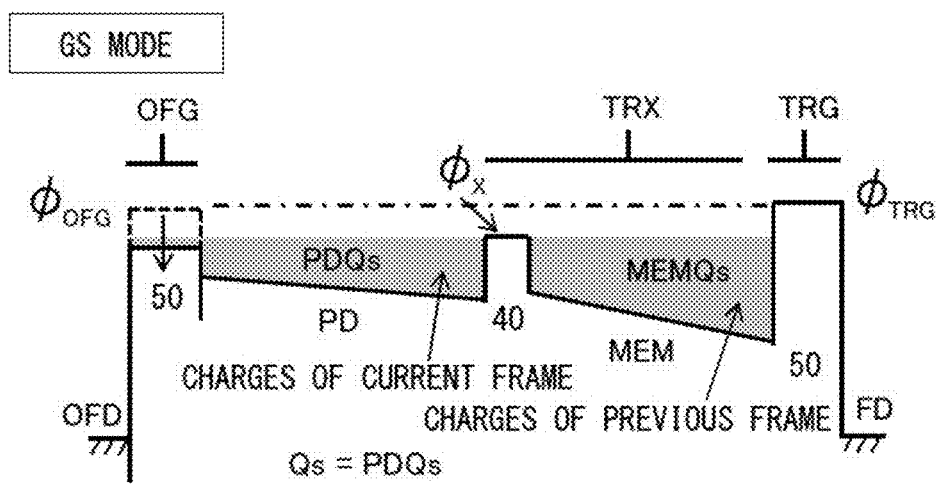
FIG. 8 illustrates an example of the one-dimensional potential in the GS mode.

FIG. 6 illustrates an example of a one-dimensional potential in the DR expansion mode. FIGS. 7 and 8 each illustrate an example of a one-dimensional potential in the GS mode.

Figure 9:
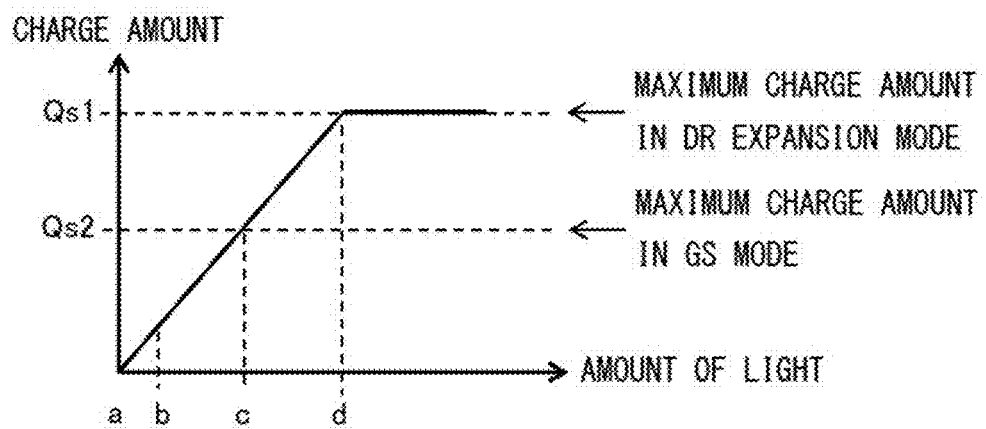
FIG. 9 illustrates an example of a saturated charge amount in the DR expansion mode and the GS mode.

FIG. 9 illustrates an example of saturated signal amounts in the DR expansion mode and the GS mode.

(DR Expansion Mode)

In the DR expansion mode, the height (potential $\varphi_X$) of the first potential barrier 40 is lower than the heights (potentials $\varphi_{TRG}$ and $\varphi_{OFG}$) of the second potential barrier 50. Accordingly, the charges stored in the photodiode PD are overflowed to the charge-holding section MEM, and thus the charges generated by the photoelectric conversion in the photodiode PD are stored not only in the photodiode PD but also in the charge-holding section MEM. Thus, a saturated charge amount Qs1 in the DR expansion mode is the sum of a saturated charge amount PDQs at the photodiode PD and a saturated charge amount MEMQs at the charge-holding section MEM.

(GS Mode)

In the GS mode, for example, as illustrated in FIG. 7, during a period when charges of the previous frame are accumulated in the charge-holding section MEM, the height (potential $\varphi_X$) of the first potential barrier 40 is shallower than the height (potential $\varphi_X$) of the first potential barrier 40 in the DR expansion mode. At this time, during the period when the charges of the previous frame are accumulated in the charge-holding section MEM, a difference between the height (potential $\varphi_X$) of the first potential barrier 40 and each of the heights (potentials $\varphi_{TRG}$ and $\varphi_{OFG}$) of the second potential barrier 50 is smaller than that in the DR expansion mode. Accordingly, the charges stored in the photodiode PD (charges in the current frame) are not overflowed to the charge-holding section MEM. That is, the solid-state imaging device 1 (specifically, the system control circuit 24) controls the height (potential $\varphi_X$) of the first potential barrier 40 not to cause a focal plane phenomenon to occur in the GS mode. Thus, a saturated charge amount Qs2 in the GS mode is equal to the saturated charge amount PDQs in the photodiode PD.

It is to be noted that, for example, as illustrated in FIG. 8, the potential $\varphi_{OFG}$ may be deepened during the period when the charges of the previous frame are accumulated in the charge-holding section MEM in the GS mode. At this time, the potential $\varphi_{OFG}$ is deeper than the potential (TRG, and is deeper than the potential $\varphi_X$. This allows the charges stored in the photodiode PD (charges of the current frame) not to be overflowed to the charge-holding section MEM, thus causing charges exceeding the saturated charge amount PDQs in the photodiode PD to go beyond the potential $\varphi_{OFG}$ and to be discharged to the floating diffusion OFG. That is, the solid-state imaging device 1 (specifically, the system control circuit 24) controls the potential $\varphi_{OFG}$ not to cause blooming to occur in the GS mode. Thus, also in this case, the saturated charge amount Qs2 in the GS mode is equal to the saturated charge amount PDQs in the photodiode PD.

[Imaging Procedure in DR Expansion Mode]

Next, description is given of an imaging procedure in the DR expansion mode.

Figure 10A:
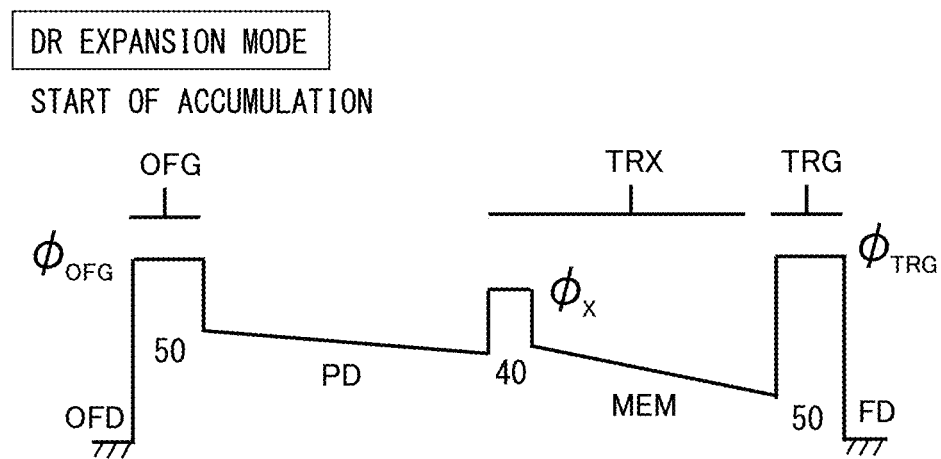
FIG. 10A illustrates an example of a one-dimensional potential at the start of accumulation in the DR expansion mode.
Figure 10B:
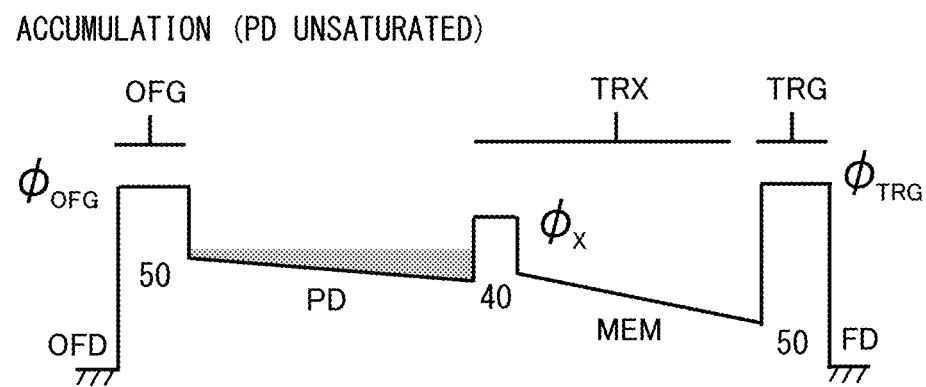
FIG. 10B illustrates an example of a one-dimensional potential at the time of accumulation (PD unsaturated) in the DR expansion mode.
Figure 10C:
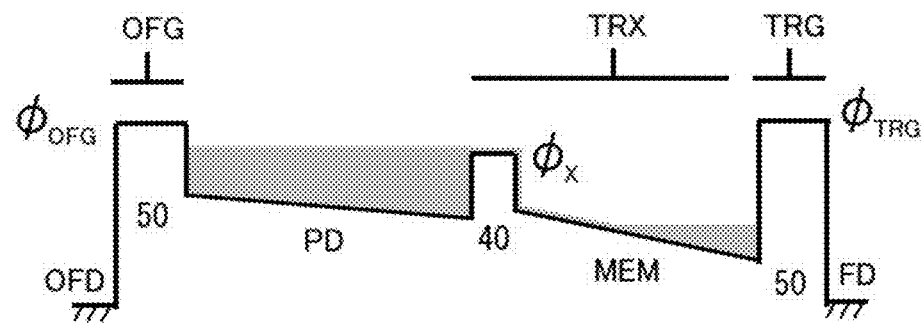
FIG. 10C illustrates an example of a one-dimensional potential at the time of accumulation (PD saturated, overflow) in the DR expansion mode.
Figure 10D:
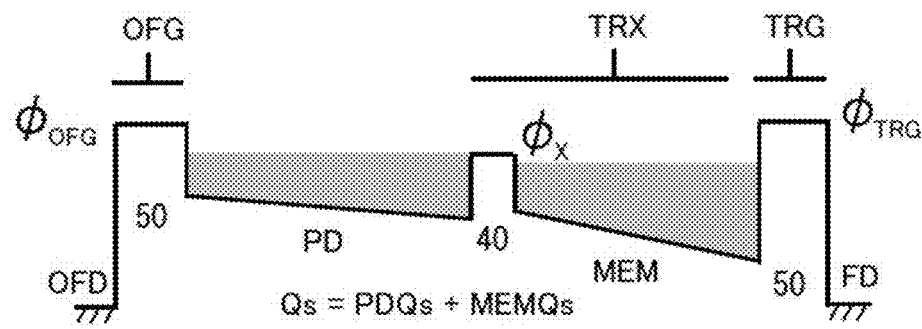
FIG. 10D illustrates an example of a one-dimensional potential at the completion of accumulation in the DR expansion mode.
Figure 10E:
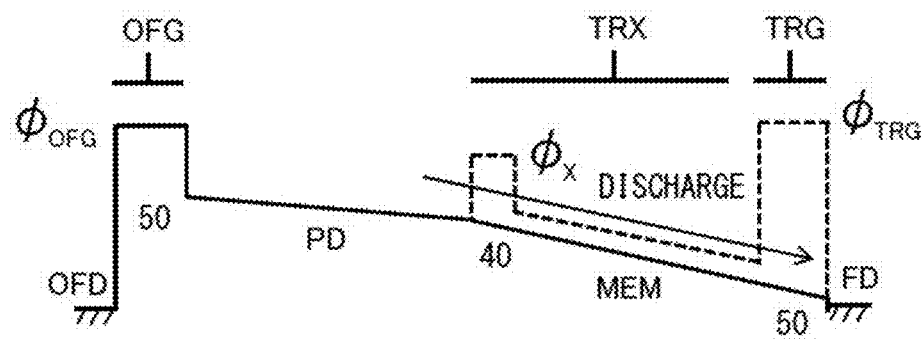
FIG. 10E illustrates an example of a one-dimensional potential at the time of reading in the DR expansion mode.
Figure 11:
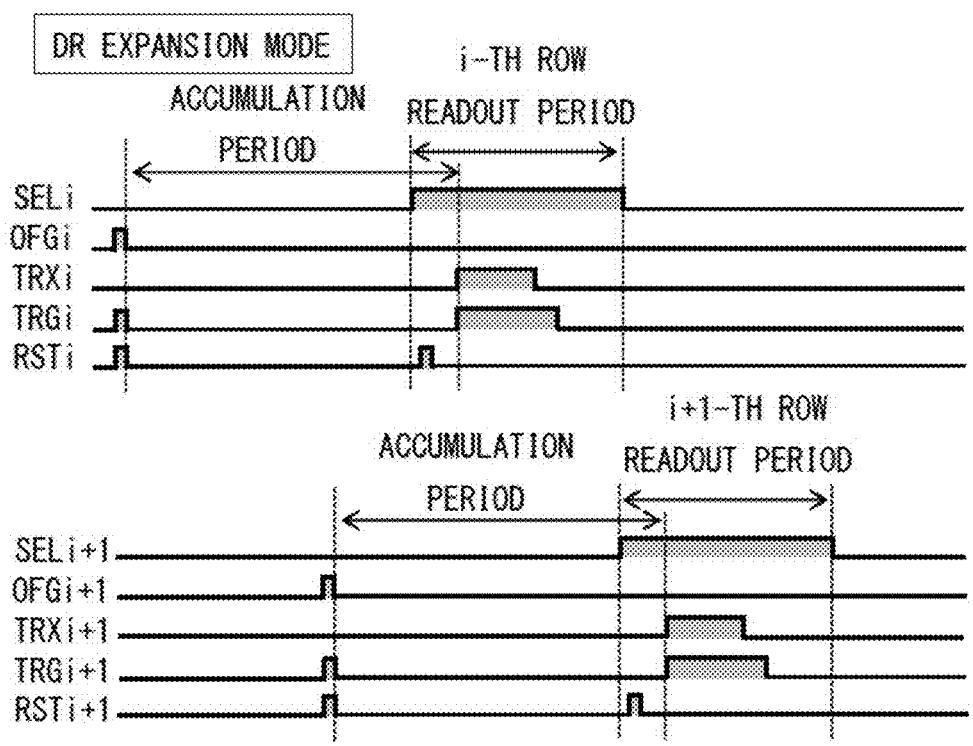
FIG. 11 illustrates an example of a timing chart in the DR expansion mode.

FIG. 10A illustrates an example of a one-dimensional potential at the start of accumulation in the DR expansion mode. FIG. 10B illustrates an example of a one-dimensional potential at the time of accumulation (PD unsaturated) in the DR expansion mode. FIG. 10C illustrates an example of a one-dimensional potential at the time of accumulation (PD saturated) in the DR expansion mode. FIG. 10D illustrates an example of a one-dimensional potential at the completion of accumulation in the DR expansion mode. FIG. 10E illustrates an example of a one-dimensional potential at the time of reading in the DR expansion mode. FIG. 11 illustrates an example of a timing chart in the DR expansion mode.

First, prior to the start of imaging, the solid-state imaging device 1 (specifically, the system control circuit 24) turns ON the second transfer transistor TRG, the discharge transistor OFG, and the reset transistor RST to discharge excess charges remaining in the photodiode PD, the floating diffusion FD, and the discharge floating diffusion OFD to the outside. Thereafter, the solid-state imaging device 1 (specifically, the system control circuit 24) starts imaging. Specifically, the solid-state imaging device 1 (specifically, the system control circuit 24) starts accumulating charges in a state where the first transfer transistor TRX, the second transfer transistor TRG, and the discharge transistor OFG are turned OFF (FIG. 10A). That is, the solid-state imaging device 1 (specifically, the system control circuit 24) causes the photodiode PD and the charge-holding section MEM to store charges in a state where the potential $\varphi_X$ is kept lower than the potentials $\varphi_{TRG}$ and $\varphi_{OFG}$ (i.e., in a state where the charges are easily overflowed). Then, the charges generated by the photoelectric conversion in the photodiode PD start to be stored in the photodiode PD (FIG. 10B).

Thereafter, when the photodiode PD is saturated, the charges stored in the photodiode PD start to be overflowed to the charge-holding section MEM (FIG. 10C). Then, when the photoelectric conversion in the photodiode PD is completed, charges in a predetermined amount generated by the photoelectric conversion in the photodiode PD are accumulated in the photodiode PD and the charge-holding section MEM (FIG. 10D). Thereafter, the solid-state imaging device 1 (specifically, the system control circuit 24) turns ON the reset transistor RST to discharge excess charges remaining in the floating diffusion FD to the outside once again, and thereafter turns ON the first transfer transistor TRX and the second transfer transistor TRG to deepen the potentials $\varphi_X$ and the $\varphi_{TRG}$, thereby discharging (transferring) the charges stored in the photodiode PD and the charge-holding section MEM to the floating diffusion FD (FIG. 10E).

At this time, the solid-state imaging device 1 (specifically, the system control circuit 24) keeps the selection transistor SEL ON. Consequently, the amplification transistor AMP generates a pixel signal of a signal level corresponding to an electric potential of the floating diffusion FD, and the generated pixel signal is outputted to the vertical signal line VSL via the selection transistor SEL. The solid-state imaging device 1 (specifically, the system control circuit 24) performs this series of operations for each predetermined unit pixel row. In this manner, the imaging in the DR expansion mode is performed.

[Imaging Procedure in GS Mode]

Next, description is given of an imaging procedure in the GS mode.

Figure 12A:
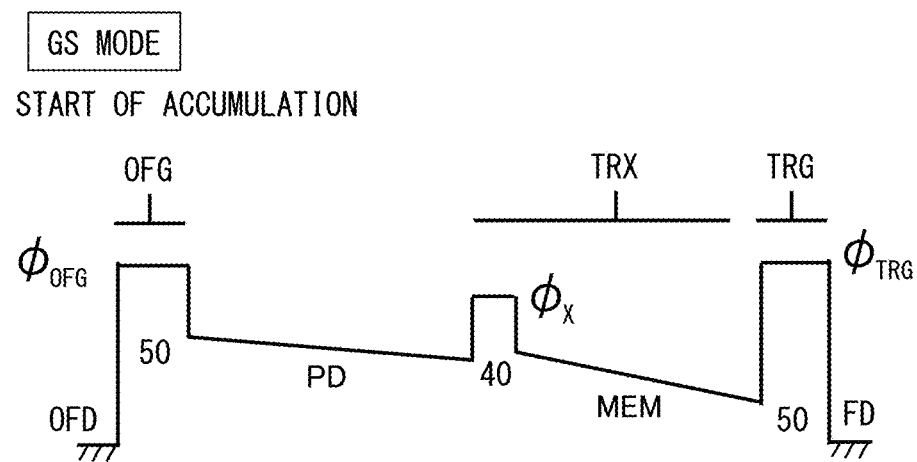
FIG. 12A illustrates an example of a one-dimensional potential at the start of accumulation in the GS mode.
Figure 12B:
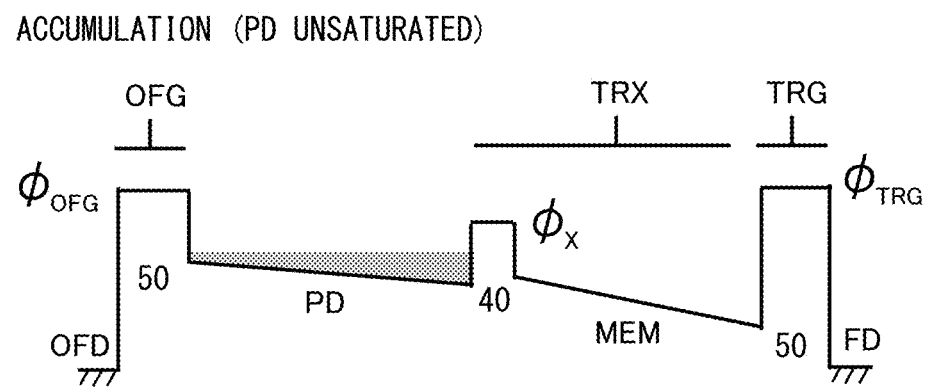
FIG. 12B illustrates an example of a one-dimensional potential at the time of accumulation (PD unsaturated) in the GS mode.
Figure 12C:
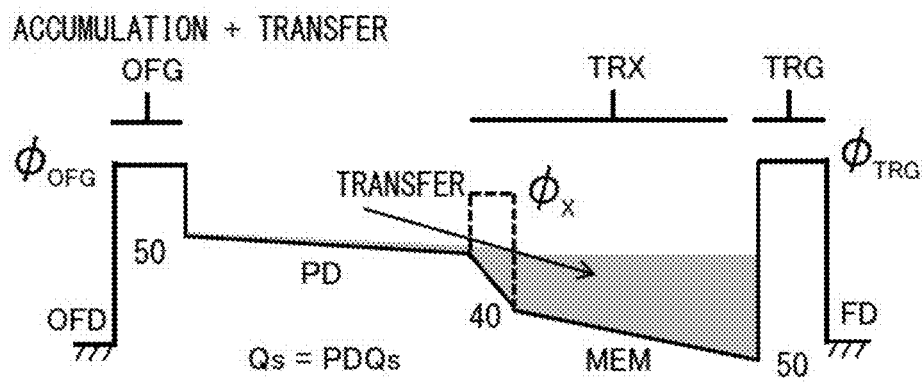
FIG. 12C illustrates an example of a one-dimensional potential at the completion of accumulation in the GS mode.
Figure 12D:
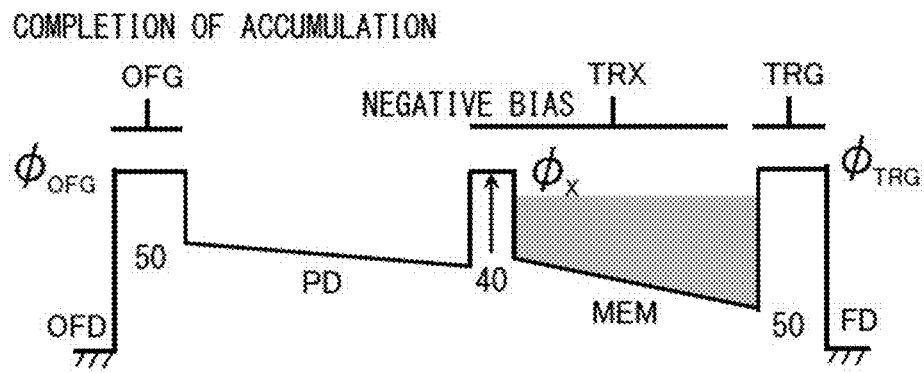
FIG. 12D illustrates an example of a one-dimensional potential at the time of reading in the GS mode.

FIG. 12A illustrates an example of a one-dimensional potential at the start of accumulation in the GS mode. FIG. 12B illustrates an example of a one-dimensional potential at the time of accumulation (PD unsaturated) in the GS mode. FIG. 12C illustrates an example of a one-dimensional potential at the completion of accumulation in the GS mode. FIG. 12D illustrates an example of a one-dimensional potential at the time of reading in the GS mode. FIG. 13 illustrates an example of a timing chart in the GS mode.

First, prior to the start of imaging, the solid-state imaging device 1 (specifically, the system control circuit 24) turns ON the second transfer transistor TRG, the discharge transistor OFG, and the reset transistor RST to discharge excess charges remaining in the photodiode PD, the floating diffusion FD, and the discharge floating diffusion OFD to the outside. Thereafter, the solid-state imaging device 1 (specifically, the system control circuit 24) starts imaging. Specifically, the solid-state imaging device 1 (specifically, the system control circuit 24) starts accumulating charges in a state where the first transfer transistor TRX, the second transfer transistor TRG, and the discharge transistor OFG are turned OFF (FIG. 12A). In such a state, the solid-state imaging device 1 (specifically, the system control circuit 24) starts accumulating charges. Then, the charges generated by the photoelectric conversion in the photodiode PD starts to be stored in the photodiode PD (FIG. 12B). Thereafter, prior to completion of the photoelectric conversion in the photodiode PD, the solid-state imaging device 1 (specifically, the system control circuit 24) turns ON the first transfer transistor TRX to deepen the potential $\varphi_X$ of the first potential barrier 40 and the potential of the charge-holding section MEM, thereby transferring the charges accumulated in the photodiode PD to the charge-holding section MEM (FIG. 12C). At this time, the solid-state imaging device 1 (specifically, the system control circuit 24) performs this transfer operation simultaneously for all of the sensor pixels 11.

Upon completion of the photoelectric conversion in the photodiode PD, the solid-state imaging device 1 (specifically, the system control circuit 24) turns OFF the first transfer transistor TRX to shallow the potential $\varphi_X$ of the first potential barrier 40 and the potential of the charge-holding section MEM (FIG. 12D). This causes charges resulting from imaging of the current frame to be confined in the charge-holding section MEM. At this time, the solid-state imaging device 1 (specifically, the system control circuit 24) applies a negative bias to the gate of the first transfer transistor TRX to thereby cause the potential $\varphi_X$ to be shallower than the time when no negative bias is applied to the gate of the first transfer transistor TRX. That is, the solid-state imaging device 1 (specifically, the system control circuit 24) applies a negative bias to the gate of the first transfer transistor TRX to thereby narrow the difference between the potential $\varphi_X$ and each of the potentials $\varphi_{TRX}$ and $\varphi_{OFG}$. At this time, the solid-state imaging device 1 (specifically, the system control circuit 24) causes the charge-holding section MEM of every sensor pixel 11 to store charges in a state where the difference between the potential $\varphi_X$ and each of the potentials $\varphi_{TRX}$ and $\varphi_{OFG}$ is narrowed. This prevents the charges stored in the photodiode PD by the imaging of the next frame from being overflowed to the charge-holding section MEM where the charges are stored by the imaging of the current frame.

Figure 12E:
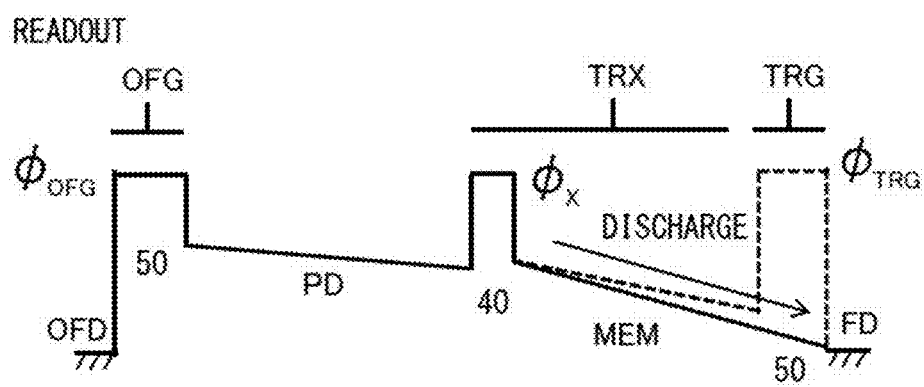
FIG. 12E illustrates an example of a one-dimensional potential at the time of transfer to an MEM in the GS mode.

Thereafter, the solid-state imaging device 1 (specifically, the system control circuit 24) turns ON the reset transistor RST to discharge excess charges remaining in the floating diffusion FD to the outside once again, and thereafter turns ON the second transfer transistor TRG to deepen the potential $\varphi_{TRG}$, thereby discharging (transferring) the charges accumulated in the charge-holding section MEM to the floating diffusion FD (FIG. 12E). At this time, the solid-state imaging device 1 (specifically, the system control circuit 24) keeps the selection transistor SEL ON. Consequently, the amplification transistor AMP generates a pixel signal of a signal level corresponding to an electric potential of the floating diffusion FD, and the generated pixel signal is outputted to the vertical signal line VSL via the selection transistor SEL. The solid-state imaging device 1 (specifically, the system control circuit 24) performs the reading operation for each predetermined unit pixel row. In this manner, the imaging in the GS mode is performed.

Figure 14:
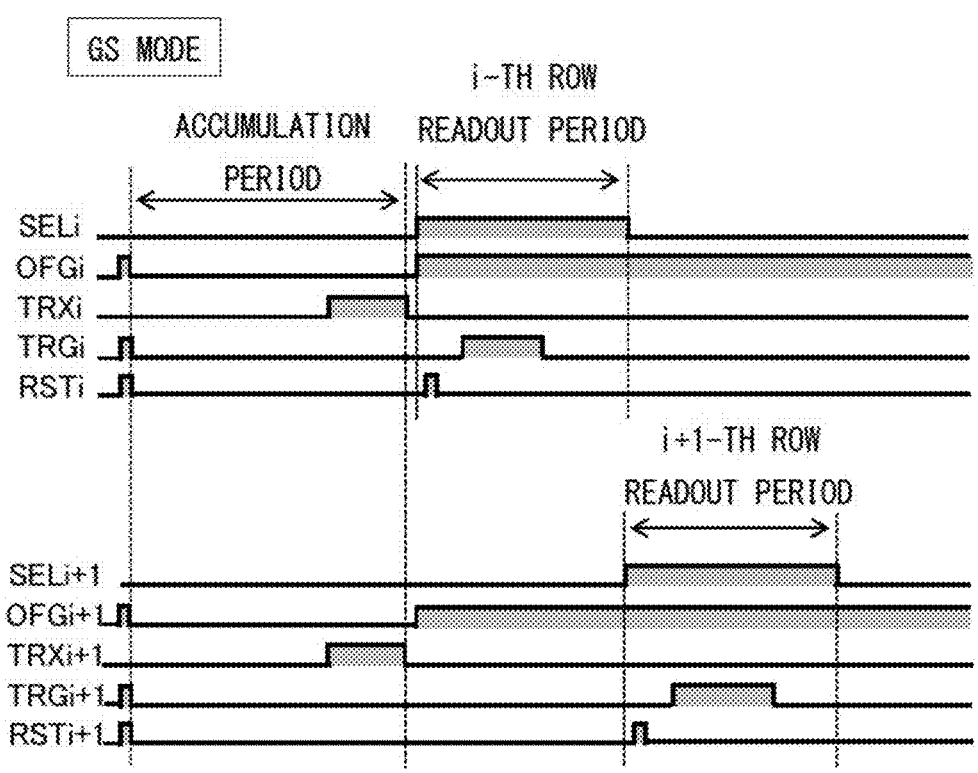
FIG. 14 illustrates a modification example of the timing chart in the GS mode.
Figure 15:
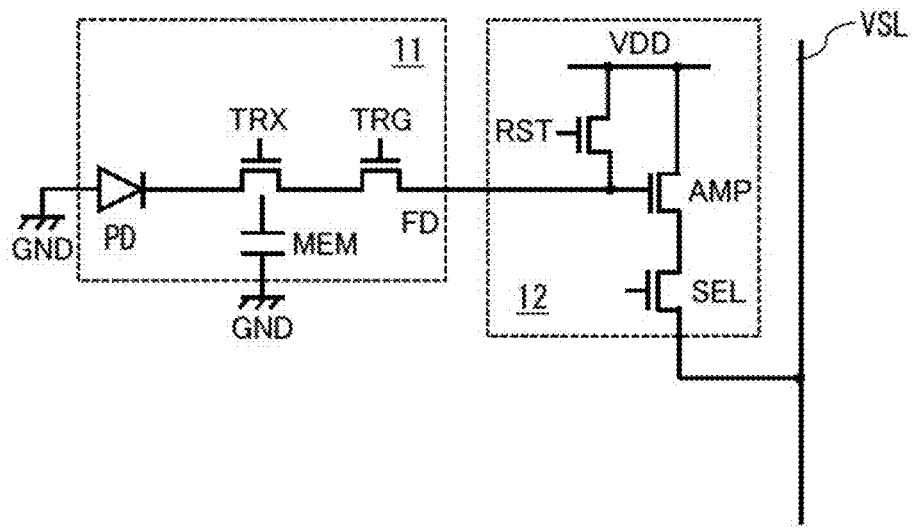
FIG. 15 illustrates a modification example of a circuit configuration of the sensor pixel and the readout circuit of FIG. 1.
Figure 16:
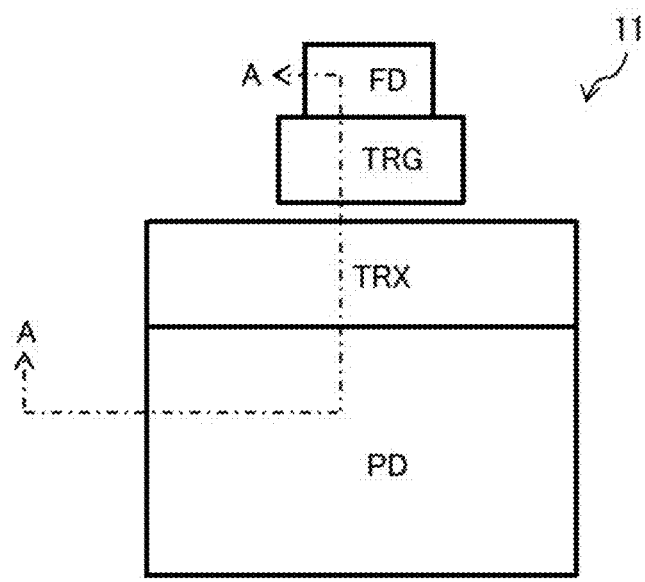
FIG. 16 illustrates a modification example of the planar configuration of the sensor pixel of FIG. 1.
Figure 17:
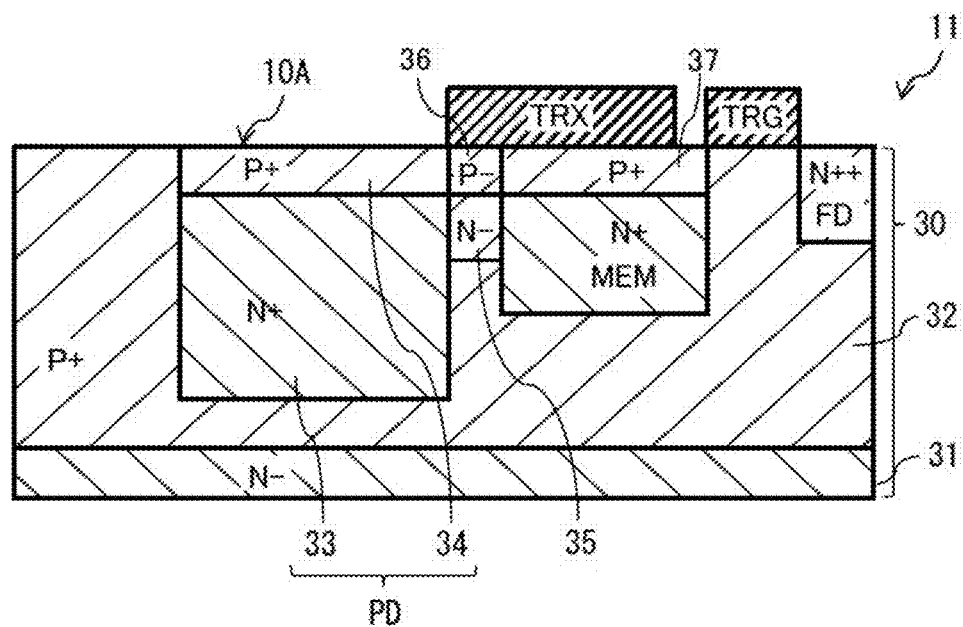
FIG. 17 illustrates an example of a cross-sectional configuration along a line A-A of FIG. 16.
Figure 18:
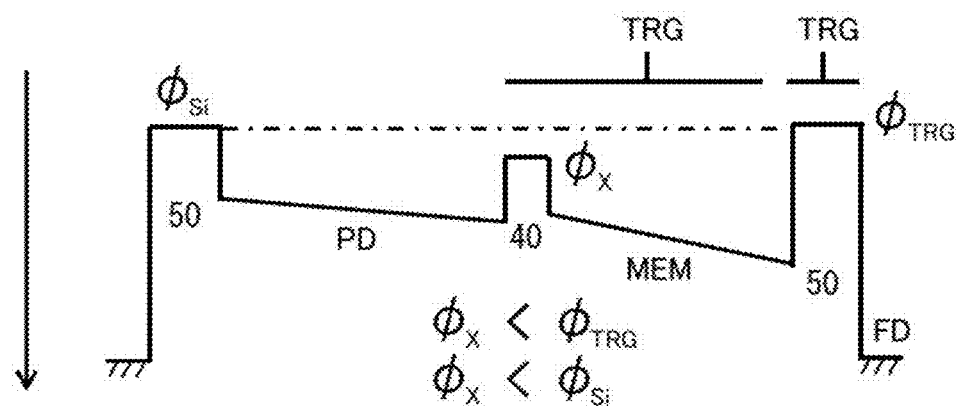
FIG. 18 illustrates an example of a one-dimensional potential along the line A-A of FIG. 16.

It is to be noted that the solid-state imaging device 1 (specifically, the system control circuit 24) may turn ON the discharge transistor OFG at the time of the reading operation, for example, as illustrated in FIG. 14, instead of applying a negative bias to the gate of the first transfer transistor TRX. In such a case, the imaging of the next frame is not performed when the charges by the imaging of the current frame are stored in the charge-holding section MEM, thus preventing the charges stored in the photodiode PD by the imaging of the next frame from being overflowed to the charge-holding section MEM where the charges by the imaging of the current frame are stored.

Effects

Next, description is given of effects of the solid-state imaging device 1 according to the present embodiment.

In a case where imaging is performed by a rolling shutter system in the CMOS image sensor, subject distortion called focal plane may occur in some instances. Therefore, it is conceivable to perform imaging by a global shutter system in which charges accumulated by photoelectric conversion in a photodiode are transferred all at once to a charge-holding section and thereafter the charges held in the charge-holding section are sequentially read. However, in such a case, an area of the photodiode becomes smaller, thus causing a dynamic range to be narrower, as compared with the case of the rolling shutter system. Accordingly, there has been an issue of necessity of selecting CMOS image sensors depending on purposes.

Meanwhile, in the present embodiment, the first potential barrier 40 provided between the photodiode PD and the charge-holding section MEM is lower than the second potential barrier 50 provided around the region including the photodiode PD, the charge-holding section MEM, the n-type semiconductor region 35, the p-type semiconductor region 36, and the p-type semiconductor region 37. This makes it possible, for example, to transfer charges stored in both of the photodiode PD and the charge-holding section MEM to the floating diffusion FD, and to transfer charges stored in the photodiode PD of each sensor pixel 11 to the charge-holding section MEM all at once and thereafter transfer the charges stored in the charge-holding section MEM to the floating diffusion FD. Here, in a case of storing charges in both of the photodiode PD and the charge-holding section MEM, it is possible to increase a saturated charge amount of each sensor pixel 11 as compared with the case of storing charges only in the photodiode PD, thus making it possible to obtain a high dynamic range. In addition, in a case of transferring the charges stored in the photodiode PD of each sensor pixel 11 all at once to the charge-holding section MEM, it is possible to reduce the subject distortion. As a result, it is possible to switch, depending on purposes, between a mode of reducing the subject distortion (GS mode) and a mode of obtaining a high dynamic range (DR expansion mode).

In addition, in the present embodiment, the first potential barrier 40 is formed by the p-type semiconductor region 36, and the second potential barrier 50 is formed by the p-well layer 32; thus, the impurity concentration of the p-type semiconductor region 36 is lower than the impurity concentration of the p-well layer 32. Consequently, controlling the impurity concentrations of the p-type semiconductor region 36 and the p-well layer 32 enables control of the potential $\varphi_X$ of the first potential barrier 40 as well as the potentials $\varphi_{TRG}$ and $\varphi_{OFG}$ of the second potential barrier 50. In this manner, in the present embodiment, diffusing impurities into the semiconductor substrate 30 allows for formation of the first potential barrier 40 and the second potential barrier 50, thus allowing for the formation of the first potential barrier 40 and the second potential barrier 50 without using any specific process.

In addition, in the present embodiment, the solid-state imaging device 1 (specifically, the system control circuit 24) controls the height (potential $\varphi_X$) of the first potential barrier 40 in accordance with an imaging mode. Specifically, in the DR expansion mode, the solid-state imaging device 1 (specifically, the system control circuit 24) keeps the height (potential $\varphi_X$) of the first potential barrier 40 lower than the heights (potentials $\varphi_{TRG}$ and $\varphi_{OFG}$) of the second potential barrier 50. This enables the charges stored in the photodiode PD to be overflowed to the charge-holding section MEM. As a result, it is possible to expand the saturated charge amount of the sensor pixel 11 to the sum of the saturated charge amount PDQs of the photodiode PD and the saturated charge amount MEMQs of the charge-holding section MEM. Meanwhile, in the GS mode, when confining charges in the charge-holding section MEM, the solid-state imaging device 1 (specifically, the system control circuit 24) applies a negative bias to the gate of the first transfer transistor TRX to cause the height (potential $\varphi_X$) of the first potential barrier 40 to be shallower than the time when no negative bias is applied to the gate of the first transfer transistor TRX. Consequently, even in a case where charges of the next frame are stored in the photodiode PD, it is possible to prevent the charges of the next frame stored in the photodiode PD from being overflowed to the charge-holding section MEM where charges of the current frame are stored.

In addition, in the present embodiment, in the DR expansion mode, the solid-state imaging device 1 (specifically, the system control circuit 24) causes the photodiode PD and the charge-holding section MEM to store charges in a state where the first potential barrier 40 is kept lower than the second potential barrier 50, and thereafter the first transfer transistor TRX and the second transfer transistor TRG are turned ON to transfer the charges stored in the photodiode PD and the charge-holding section MEM to the floating diffusion FD. This makes it possible to expand the saturated charge amount of the sensor pixel 11 to the sum of the saturated charge amount PDQs of the photodiode PD and the saturated charge amount MEMQs of the charge-holding section MEM.

In addition, in the present embodiment, in the GS mode, the solid-state imaging device 1 (specifically, the system control circuit 24) causes the charge-holding section MEM of every sensor pixel 11 to store charges in a state where the difference between the height of the first potential barrier 40 and the height of the second potential barrier 50 is narrowed, and thereafter the second transfer transistor TRG is turned ON to transfer the charges stored in the charge-holding section MEM to the floating diffusion FD. This makes it possible to reduce the subject distortion.

In addition, in the present embodiment, in the GS mode, the solid-state imaging device 1 (specifically, the system control circuit 24) applies a negative bias to the gate of the first transfer transistor TRX to narrow the difference between the height of the first potential barrier 40 and the height of the second potential barrier 50. This makes it possible to reduce the subject distortion using simple control.

2. Modification Examples

Hereinafter, description is given of modification examples of the solid-state imaging device 1 according to the foregoing embodiment.

Modification Example A

In the foregoing embodiment, as illustrated in FIGS. 15, 16, 17, and 18, for example, the discharge transistor OFG and the discharge floating diffusion OFD may be omitted in each sensor pixel 11. In this case, a potential (psi of a location, of the second potential barrier 50, where the discharge transistor OFG is formed is the potential of the p-well layer 32. In this manner, even in a case where the discharge transistor OFG and the discharge floating diffusion OFD are omitted, it is possible to switch, depending on purposes, between the mode of reducing the subject distortion (GS mode) and the mode of obtaining a high dynamic range (DR expansion mode).

Modification Example B

Figure 19:
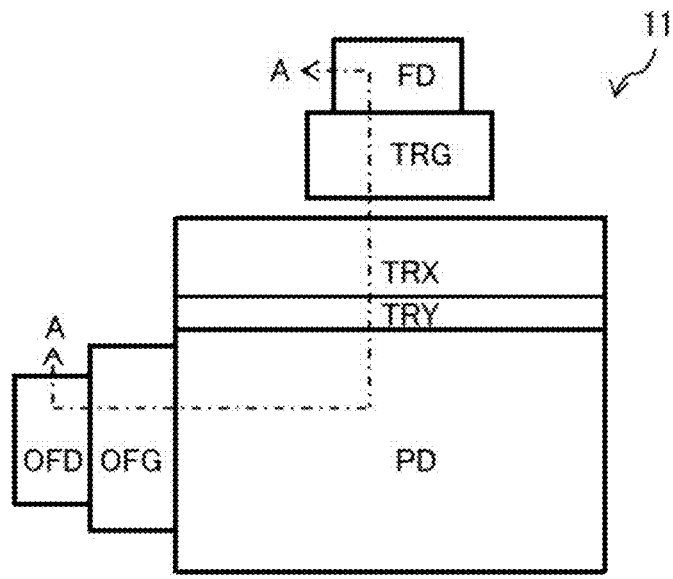
FIG. 19 illustrates a modification example of the planar configuration of the sensor pixel of FIG. 1.
Figure 20:
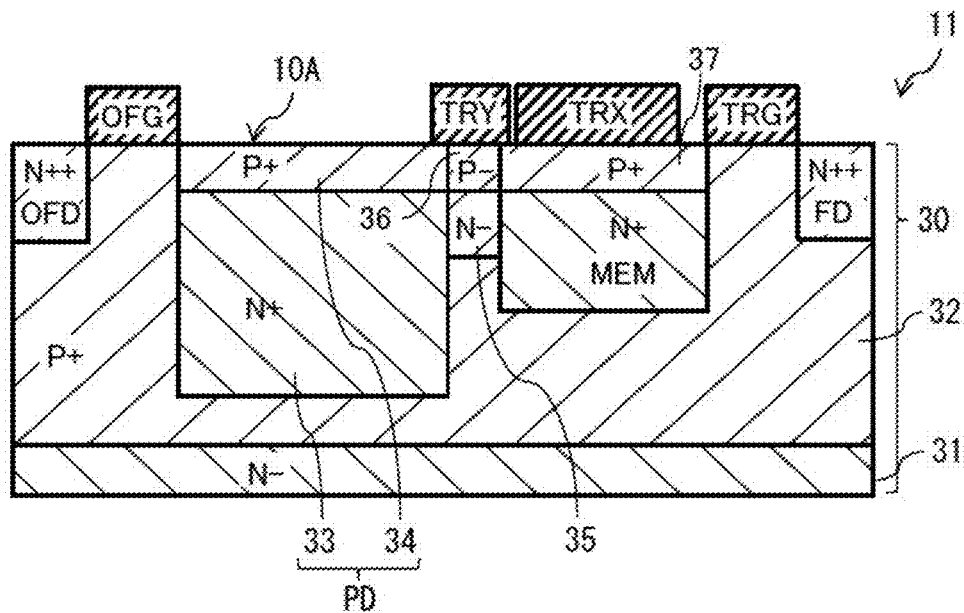
FIG. 20 illustrates an example of a cross-sectional configuration along a line A-A of FIG. 19.
Figure 21:
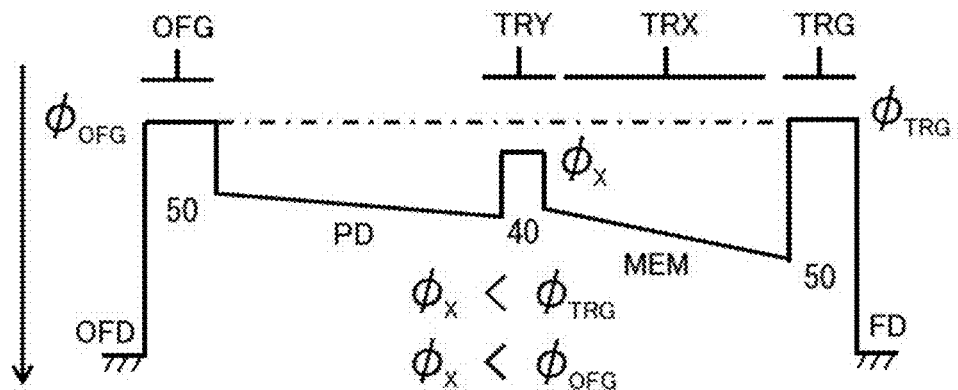
FIG. 21 illustrates an example of a one-dimensional potential along the line A-A of FIG. 19.

In the foregoing embodiment, as illustrated in FIGS. 19, 20, and 21, for example, each sensor pixel 11 may further include a control transistor TRY that controls the height of the first potential barrier 40. In this case, the first potential barrier 40 is formed at a location opposed to a gate of the control transistor TRY, but no first potential barrier 40 is formed at the location opposed to the gate of the first transfer transistor TRX.

Figure 22:
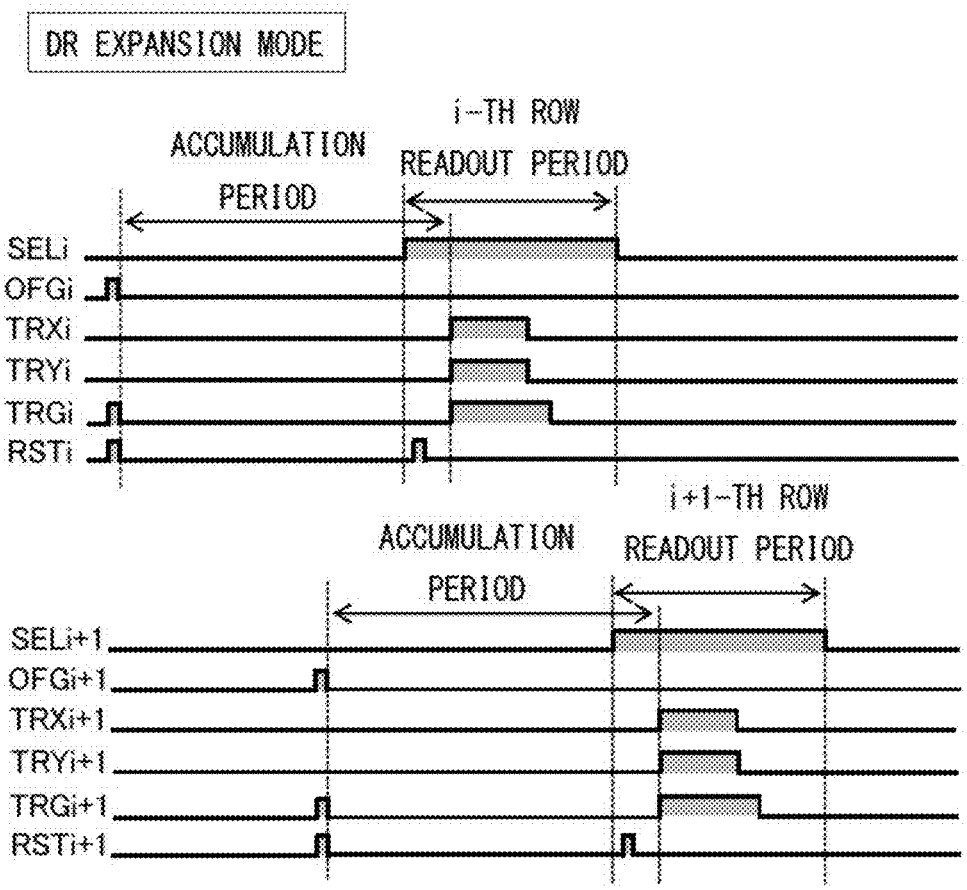
FIG. 22 illustrates an example of a timing chart in the DR expansion mode.

In this case, in the phase of FIG. 10E of the DR expansion mode, the solid-state imaging device 1 (specifically, the system control circuit 24) turns ON the first transfer transistor TRX, the second transfer transistor TRG, and the control transistor TRY to deepen the potentials $\varphi_X$ and $\varphi_{TRG}$, thereby discharging (transferring) charges stored in the photodiode PD and the charge-holding section MEM to the floating diffusion FD (FIG. 22).

Figure 23:
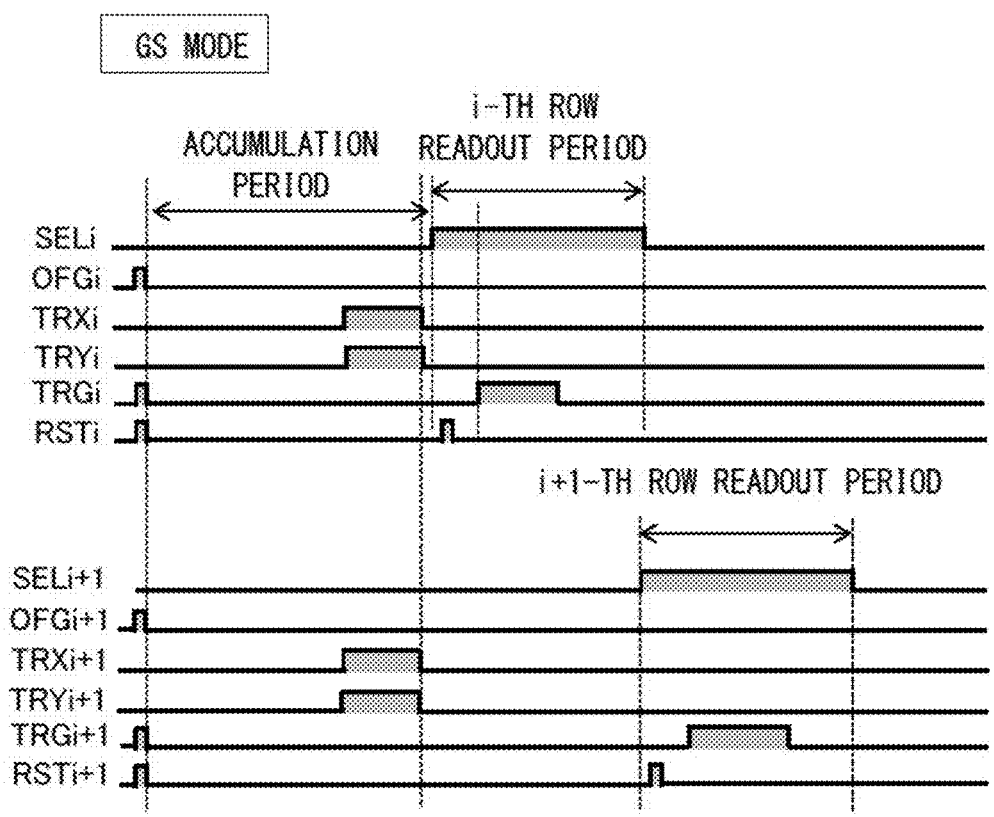
FIG. 23 illustrates an example of a timing chart in the GS mode.

In addition, in the phase of FIG. 12C of the GS mode, prior to completion of the photoelectric conversion in the photodiode PD, the solid-state imaging device 1 (specifically, the system control circuit 24) turns ON the first transfer transistor TRX and the control transistor TRY to deepen the potential $\varphi_X$ of the first potential barrier 40 and the potential of the charge-holding section MEM, thereby transferring the charges accumulated in the photodiode PD to the charge-holding section MEM (FIG. 23). In addition, in the phase of FIG. 12D of the GS mode, at the completion of the photoelectric conversion in the photodiode PD, the solid-state imaging device 1 (specifically, the system control circuit 24) turns OFF the first transfer transistor TRX and the control transistor TRY to shallow the potential $\varphi_X$ of the first potential barrier 40 and the potential of the charge-holding section MEM (FIG. 23). Further, in the phase of FIG. 12D of the GS mode, the solid-state imaging device 1 (specifically, the system control circuit 24) applies a negative bias to the gate of the control transistor TRY to thereby cause the potential $\varphi_X$ to be shallower than the time when no negative bias is applied to the gate of the first transfer transistor TRX. In addition, in the phase of FIG. 12E of the GS mode, the solid-state imaging device 1 (specifically, the system control circuit 24) turns ON the reset transistor RST to discharge excess charges remaining in the floating diffusion FD to the outside once again, and thereafter turns ON the second transfer transistor TRG to deepen the potential $\varphi_{TRG}$, thereby discharging (transferring) the charges accumulated in the charge-holding section MEM to the floating diffusion FD (FIG. 23).

In this manner, in the present modification example, the solid-state imaging device 1 (specifically, the system control circuit 24) is able to apply a negative bias to the gate of the control transistor TRY in the GS mode to narrow the difference between the height of the first potential barrier 40 and the height of the second potential barrier 50. That is, the solid-state imaging device 1 (specifically, the system control circuit 24) is able to control the potential of the charge-holding section MEM and the potential of the first potential barrier 40 independently of each other.

Figure 24:
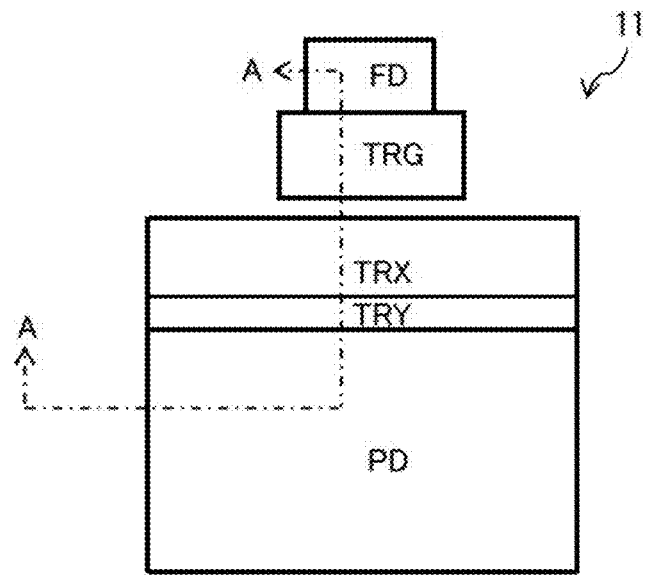
FIG. 24 illustrates a modification example of the planar configuration of the sensor pixel of FIG. 1.
Figure 25:
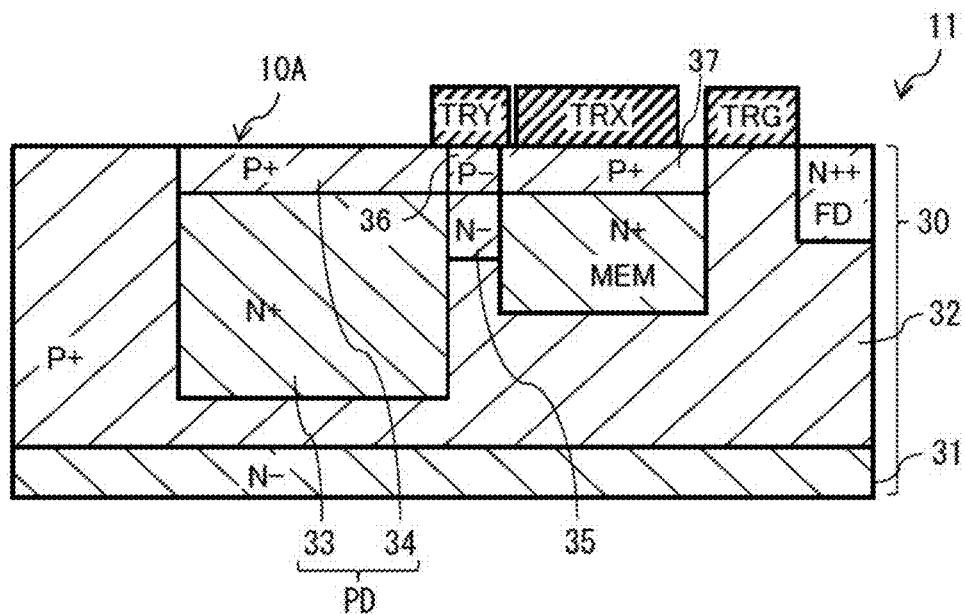
FIG. 25 illustrates an example of a cross-sectional configuration along a line A-A of FIG. 24.
Figure 26:
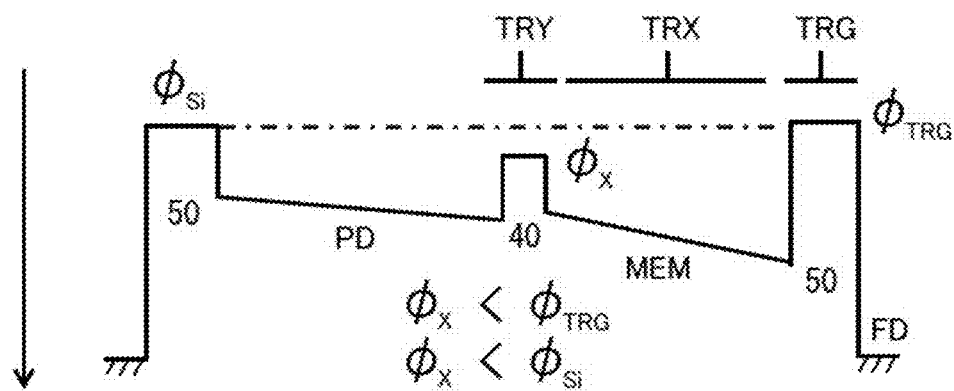
FIG. 26 illustrates an example of a one-dimensional potential along the line A-A of FIG. 24.
Figure 27:
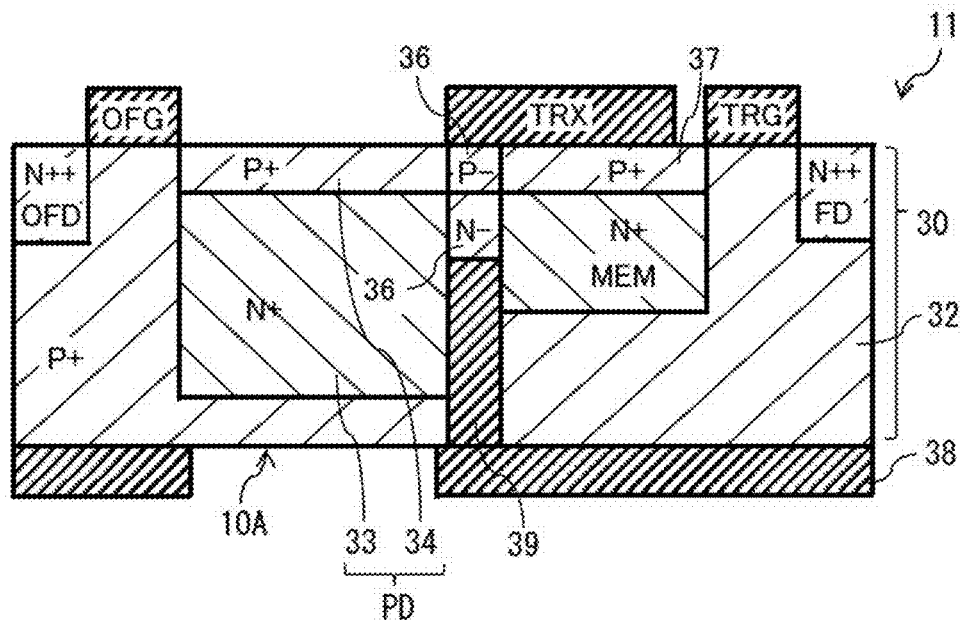
FIG. 27 illustrates a modification example of the cross-sectional configuration along the line A-A of FIG. 3.
Figure 28:
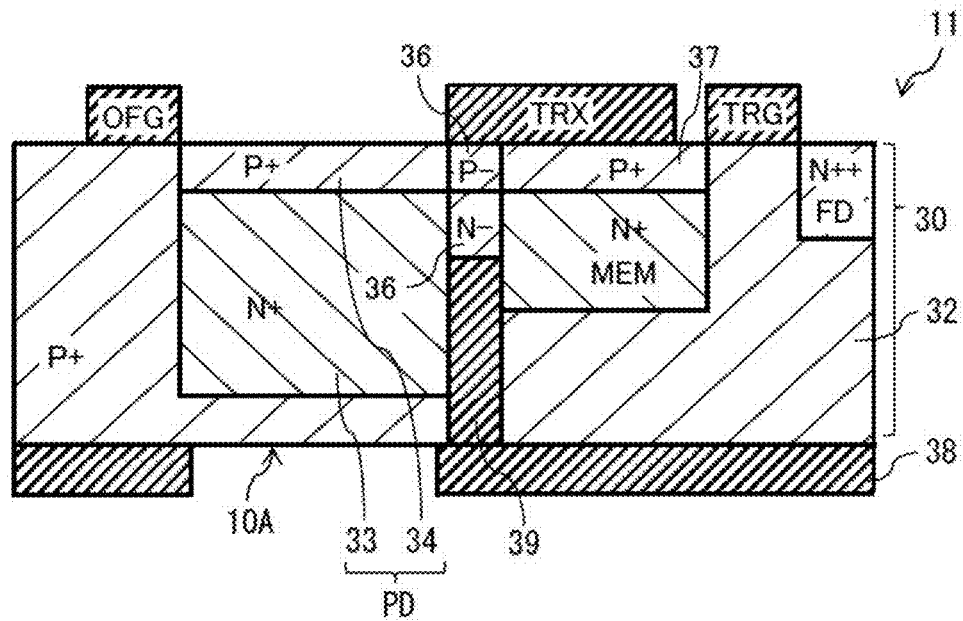
FIG. 28 illustrates a modification example of the cross-sectional configuration along the line A-A of FIG. 15.
Figure 29:
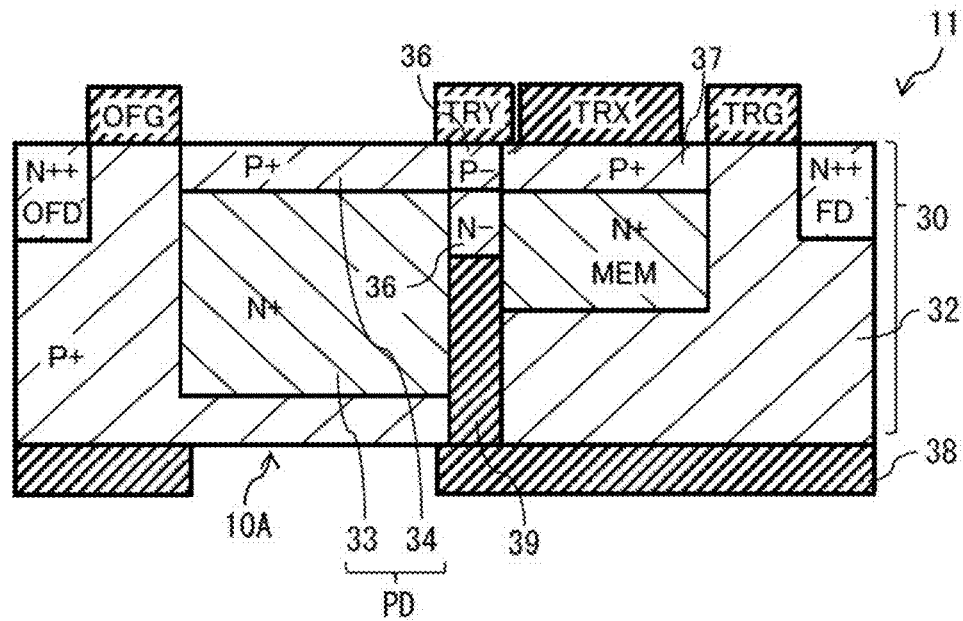
FIG. 29 illustrates a modification example of the cross-sectional configuration along the line A-A of FIG. 18.
Figure 30:
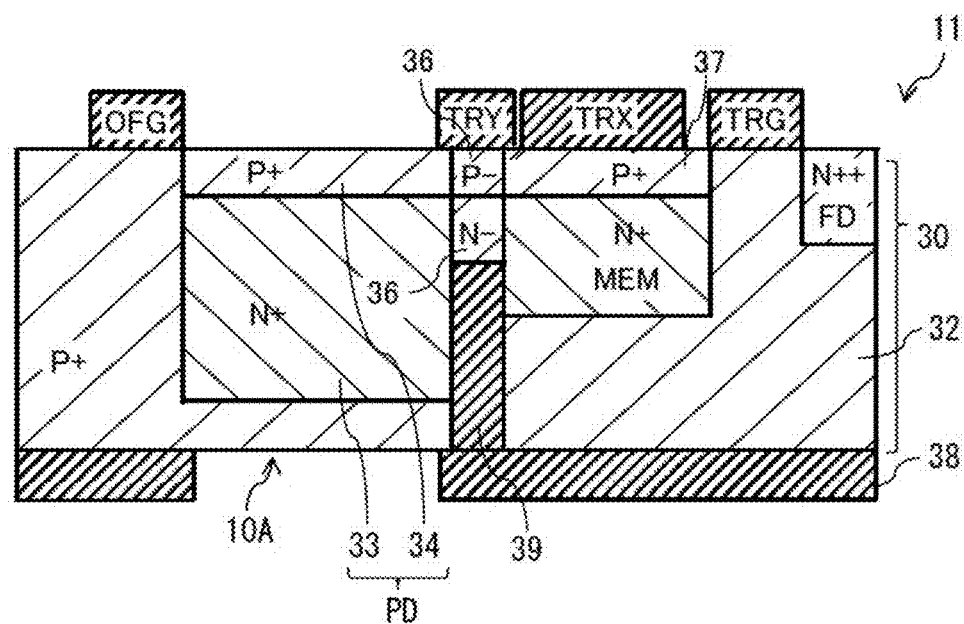
FIG. 30 illustrates a modification example of the cross-sectional configuration along the line A-A of FIG. 23.

It is to be noted that, in the present modification example, as illustrated in FIGS. 24, 25, and 26, for example, the discharge transistor OFG and the discharge floating diffusion OFD may be omitted in each sensor pixel 11. In this case, a potential $\varphi_{Si}$ of a location, of the second potential barrier 50, where the discharge transistor OFG is formed is the potential of the p-well layer 32. In this manner, even in a case where the discharge transistor OFG and the discharge floating diffusion OFD are omitted, it is possible to switch, depending on purposes, between the mode of reducing the subject distortion (GS mode) and the mode of obtaining a high dynamic range (DR expansion mode).

Modification Example C

In the foregoing embodiment and modification example thereof, the solid-state imaging device 1 may be a backside illumination type illumination type image sensor. The backside illumination type image sensor refers to an image sensor of a configuration in which a photoelectric conversion section such as a photodiode that receives light from a subject and converts the received light into an electric signal is provided between a light-receiving surface on which light from the subject is incident and a wiring layer provided with a wiring line such as a transistor that drives each pixel.

For example, as illustrated in FIGS. 27, 28, 29, and 30, each sensor pixel 11 includes a light-shielding layer 38 in contact with a back surface of the semiconductor substrate 30, and a light-shielding wall 39 provided between the photodiode PD and the charge-holding section MEM and directly below the n-type semiconductor region 35. The light-shielding layer 38 has an opening at a location opposed to the photodiode PD, and the back surface of the semiconductor substrate 30 is exposed to a bottom surface of the opening. In addition, a region, of the back surface of the semiconductor substrate 30, exposed to the bottom surface of the opening constitutes the light-receiving surface 10A. The light-shielding layer 38 and the light-shielding wall 39 are each configured by, for example, a metal such as tungsten, and blocks incidence of light from the outside on the charge-holding section MEM. Providing the light-shielding layer 38 and the light-shielding wall 39 blocks the incident of light from the outside on the charge-holding section MEM, thus making it possible to reduce noise generated by the incidence of the light on the charge-holding section MEM.

In the present modification example, the solid-state imaging device 1 is the backside illumination type illumination type image sensor. Even in this case, similarly to the foregoing embodiment, it is possible to switch, depending on purposes, between the mode of reducing the subject distortion (GS mode) and the mode of obtaining a high dynamic range (DR expansion mode).

3. Application Example

The present disclosure is not limited to the application to the solid-state imaging device. That is, the present technology is applicable to, in addition to the solid-state imaging device, overall electronic apparatuses including the solid-state imaging device, such as a camera module including an optical lens system, etc., imaging apparatuses such as a digital still camera or a video camera, a portable terminal device having an imaging function (e.g., a smartphone or a tablet-type terminal), or a copying machine using the solid-state imaging device as an image reading unit.

Figure 31:
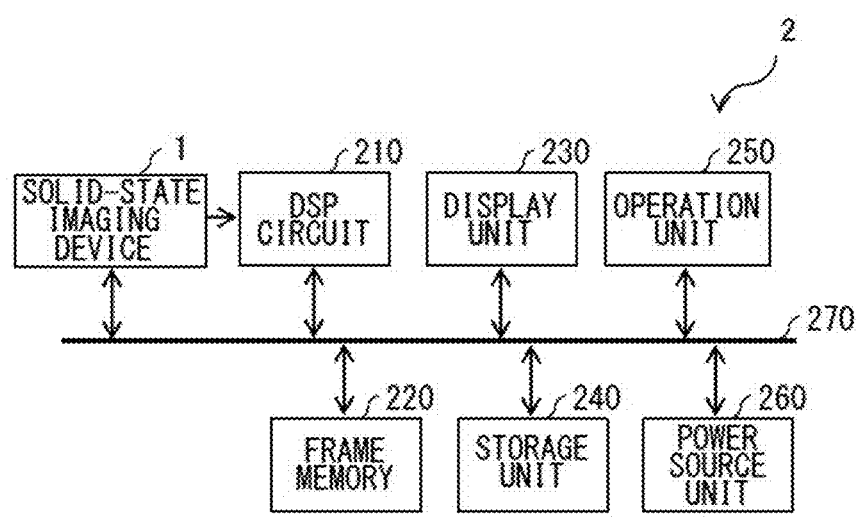
FIG. 31 illustrates an example of a schematic configuration of an electronic apparatus including a solid-state imaging device according to any of the above-described embodiment and a modification example thereof.

FIG. 31 illustrates a block diagram illustrating a configuration example of an electronic apparatus 2 including the solid-state imaging device 1 according to any of the foregoing embodiment and modification example thereof.

The electronic apparatus 2 is, for example, an imaging apparatus such as a digital still camera or a video camera, or a portable terminal device such as a smartphone or a tablet-type terminal. The electronic apparatus 2 includes, for example, the solid-state imaging device 1 according to any of the foregoing embodiment and modification example thereof, a DSP circuit 210, a frame memory 220, a display unit 230, a storage unit 240, an operation unit 250, and a power source unit 260. The DSP circuit 210 corresponds to a specific example of a "signal processing circuit" of the present disclosure. In the electronic apparatus 2, the DSP circuit 210, the frame memory 220, the display unit 230, the storage unit 240, the operation unit 250, and the power source unit 260 are coupled to one another via a bus line 270.

The solid-state imaging device 1 according to any of the foregoing embodiment and modification example thereof outputs image data corresponding to incident light. The DSP circuit 210 is a signal processing circuit that processes a signal (image data) outputted from the solid-state imaging device 1 according to any of the foregoing embodiment and modification example thereof. The frame memory 220 temporarily holds the image data processed by the DSP circuit 210 in a frame unit. The display unit 230 includes, for example, a panel-type display device such as a liquid crystal panel or an organic EL (Electro Luminescence) panel, and displays a moving image or a still image captured by the solid-state imaging device 1 according to any of the foregoing embodiment and modification example thereof. The storage unit 240 records image data of a moving image or a still image captured by the solid-state imaging device 1 according to any of the foregoing embodiment and modification example thereof in a recording medium such as a semiconductor memory or a hard disk. The operation unit 250 issues an operation command for various functions of the electronic apparatus 2 in accordance with an operation by the user. The power source unit 260 appropriately supplies various types of power for operation to the DSP circuit 210, the frame memory 220, the display unit 230, the storage unit 240, and the operation unit 250 which are supply targets.

Next, description is given of an imaging procedure in the electronic apparatus 2.

Figure 32:
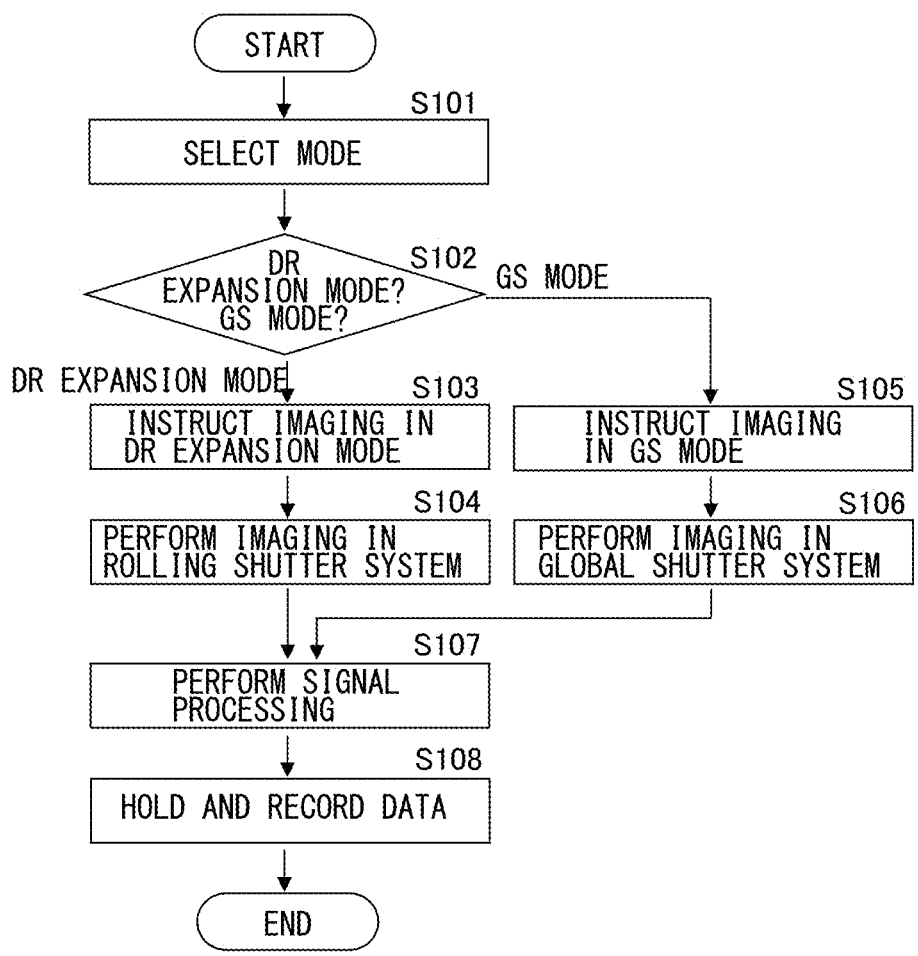
FIG. 32 illustrates an example of a flowchart of a switching operation between the DR expansion mode and the GS mode in the electronic apparatus of FIG. 31.

FIG. 32 illustrates an example of a flowchart of a switching operation between the DR expansion mode and the GS mode in the electronic apparatus 2. A user selects an imaging mode by operating the operation unit 250 (step S101). The operation unit 250 displays, for example, an interface (screen) that allows the user to select one of an imaging mode (DR expansion mode) corresponding to a rolling shutter operation and an imaging mode (GS mode) corresponding to a global shutter operation. For example, the user selects one of the imaging modes while viewing the interface (screen).

In a case where the imaging mode selected by the user is the DR expansion mode, the operation unit 250 transmits an imaging command in the DR expansion mode to the solid-state imaging device 1 (steps S102 and S103). In accordance with the selection by the user, the solid-state imaging device 1 (specifically, the system control circuit 24) executes one of the operation corresponding to the DR expansion mode and the operation corresponding to the GS mode. In a case where the imaging command in the DR expansion mode is received, the solid-state imaging device 1 (specifically, the system control circuit 24) performs imaging in the rolling shutter system in procedures illustrated in FIGS. 10A to 10E and 11, for example (step S104).

On the other hand, in a case where the imaging mode selected by the user is the GS mode, the operation unit 250 transmits an imaging command in the GS mode to the solid-state imaging device 1 (steps S102 and S105). In accordance with the selection by the user, the solid-state imaging device 1 (specifically, the system control circuit 24) executes one of the operation corresponding to the DR expansion mode and the operation corresponding to the GS mode. In a case where the imaging command in the GS mode is received, the solid-state imaging device 1 (specifically, the system control circuit 24) preforms imaging in the global shutter system in procedures illustrated in FIGS. 12A to 12E and 13, for example (step S106).

The solid-state imaging device 1 outputs image data obtained by the imaging to the DSP circuit 210. The DSP circuit 210 performs predetermined signal processing on the image data inputted from the solid-state imaging device 1 (step S107). The DSP circuit 210 causes the frame memory 220 to hold the image data having been subjected to the predetermined signal processing, and the frame memory 220 causes the storage unit 240 to store the image data as necessary (step S108). In this manner, the imaging in the electronic apparatus 2 is performed.

In the electronic apparatus 2, in the electronic apparatus 2, the solid-state imaging device 1 according to any of the foregoing embodiment and modification example thereof is used. This makes it possible to switch, depending on purposes, between the mode of reducing the subject distortion (GS mode) and the mode of obtaining a high dynamic range (DR expansion mode).

The electronic apparatus 2 displays an interface (screen) that allows the user to select one of the DR expansion mode and the GS mode. This enables the user to perform imaging in an appropriate mode depending on purposes of the user.

Figure 33:
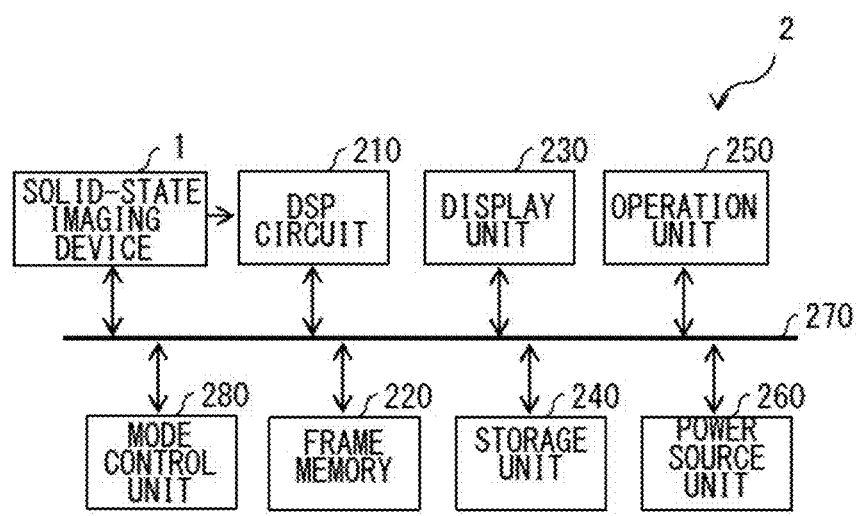
FIG. 33 illustrates a modification example of the schematic configuration of the electronic apparatus including the solid-state imaging device according to any of the above-described embodiment and a modification example thereof.

It is to be noted that, as illustrated in FIG. 33, for example, the electronic apparatus 2 may further include a mode control unit 280 that selects one of the DR expansion mode and the GS mode on the basis of image data obtained from the solid-state imaging device 1 and that instructs the solid-state imaging device 1 to execute an operation corresponding to the selected imaging mode. In such a case, the solid-state imaging device 1 (specifically, the system control circuit 24) executes one of the operation corresponding to the DR expansion mode and the operation corresponding to the GS mode in accordance with the instruction by the mode control unit 280. Thus, even when the user lacks knowledge of the imaging mode, it is possible to automatically select an appropriate mode.

4. Example of Practical Application

The technology according to an embodiment of the present disclosure (present technology) is applicable to various products. For example, the technology according to an embodiment of the present disclosure may be achieved in the form of an apparatus to be mounted to a mobile body of any kind. Non-limiting examples of the mobile body may include an automobile, an electric vehicle, a hybrid electric vehicle, a motorcycle, a bicycle, any personal mobility device, an airplane, an unmanned aerial vehicle (drone), a vessel, and a robot.

FIG. 34 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 34, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 34, an audio speaker 12061, a display section 12062, and an instrument panel 12063 are illustrated as the output device. The display section 12062 may, for example, include at least one of an on-board display and a head-up display.

FIG. 35 is a diagram depicting an example of the installation position of the imaging section 12031.

In FIG. 35, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 35 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

The description has been given hereinabove of one example of the mobile body control system, to which the technology according to an embodiment of the present disclosure may be applied. The technology according to an embodiment of the present disclosure may be applied to the imaging section 12031 among components of the configuration described above. Specifically, the solid-state imaging device 1 according to any of the foregoing embodiment and modification example thereof is applicable to the imaging section 12031. The application of the technology according to an embodiment of the present disclosure to the imaging section 12031 allows for a high-definition captured image with less noise, thus making it possible to perform highly accurate control utilizing the captured image in the mobile body control system.

Although the description has been given hereinabove of the present disclosure with reference to the embodiment and modification example thereof, the application example, and the practical application example, the present disclosure is not limited to the foregoing embodiments, etc., and various modifications may be made. It is to be noted that the effects described herein are merely illustrative. The effects of the present disclosure are not limited to those described herein. The present disclosure may have other effects than those described herein.

In addition, the present disclosure may also have the following configurations.

(1)

A solid-state imaging device including:

a light-receiving surface; and a plurality of pixels arranged to face the light-receiving surface, each of the pixels including a photoelectric conversion section that photoelectrically converts light incident via the light-receiving surface, a charge-holding section that holds charges transferred from the photoelectric conversion section, a first potential barrier provided between the photoelectric conversion section and the charge-holding section, and a second potential barrier provided around a region including the photoelectric conversion section, the charge-holding section, and the first impurity semiconductor region, the first potential barrier being lower than the second potential barrier.

(2)

The solid-state imaging device according to (1), in which the first potential barrier is formed by the first impurity semiconductor region, the second potential barrier is formed by a second impurity semiconductor region, and an impurity concentration of the first impurity semiconductor region is lower than an impurity concentration of the second impurity semiconductor region.

(3)

The solid-state imaging device according to (1) or (2), in which each of the pixels further includes a first transfer transistor that controls a potential of the charge-holding section, a second transfer transistor that transfers the charges held in the charge-holding section to a floating diffusion, and a control section that controls the first transfer transistor and the second transfer transistor, the control section controls a height of the first potential barrier in accordance with an imaging mode.

(4)

The solid-state imaging device according to (3), in which, in a first imaging mode, the control section causes the photoelectric conversion section and the charge-holding section to store charges in a state where the first potential barrier is kept lower than the second potential barrier, and thereafter turns ON the first transfer transistor and the second transfer transistor to transfer the charges stored in the photoelectric conversion section and the charge-holding section to the floating diffusion.

(5)

The solid-state imaging device according to (3), in which, in a second imaging mode, the control section causes the charge-holding section of all of the sensor pixels to store charges in a state where a difference between the height of the first potential barrier and a height of the second potential barrier is narrowed, and thereafter turns ON the second transfer transistor to transfer the charges stored in the charge-holding section to the floating diffusion.

(6)

The solid-state imaging device according to (5), in which, in the second imaging mode, the control section applies a negative bias to a gate of the first transfer transistor to narrow the difference between the height of the first potential barrier and the height of the second potential barrier.

(7)

The solid-state imaging device according to (5), in which each of the pixels further includes a control transistor that controls the height of the first potential barrier, and the control section applies a negative bias to a gate of the control transistor in the second imaging mode to narrow the difference between the height of the first potential barrier and the height of the second potential barrier.

(8)

An electronic apparatus including:

a solid-state imaging device that outputs image data corresponding to incident light; and a signal processing circuit that processes the image data, the solid-state imaging device including a light-receiving surface, and a plurality of pixels arranged to face the light-receiving surface, each of the pixels including a photoelectric conversion section that photoelectrically converts light incident via the light-receiving surface, a charge-holding section that holds charges transferred from the photoelectric conversion section, a first potential barrier provided between the photoelectric conversion section and the charge-holding section, and a second potential barrier provided around a region including the photoelectric conversion section, the charge-holding section, and the first impurity semiconductor region, the first potential barrier being lower than the second potential barrier.

(9)

The electronic apparatus according to (8), further including an interface that allows a user to select one of a first imaging mode corresponding to a rolling shutter operation and a second imaging mode corresponding to a global shutter operation, in which the solid-state imaging device executes one of an operation corresponding to the first imaging mode and an operation corresponding to the second imaging mode in accordance with the selection by the user.

(10)

The electronic apparatus according to (8), further including a mode control unit that selects, on a basis of the image data, one of a first imaging mode corresponding to a rolling shutter operation and a second imaging mode corresponding to a global shutter operation to instruct the solid-state imaging device to execute an operation corresponding to the selected imaging mode, in which the solid-state imaging device executes one of an operation corresponding to the first imaging mode and an operation corresponding to the second imaging mode in accordance with the instruction by the mode control unit.

According to the solid-state imaging device and the electronic apparatus of respective embodiments of the present disclosure, the first potential barrier provided between the photoelectric conversion section and the charge-holding section is lower than the second potential barrier provided around a region including the photoelectric conversion section, the charge-holding section, and the first impurity semiconductor region, thus making it possible, for example, to transfer charges stored in both of the photoelectric conversion section and the charge-holding section to a floating diffusion, or to transfer charges stored in the photoelectric conversion section of each of the pixels all at once to the charge-holding section and thereafter transfer the charges stored in the charge-holding section to the floating diffusion. Here, in a case of storing charges in both of the photoelectric conversion section and the charge-holding section, it is possible to increase a saturated charge amount of each of the pixels as compared with the case of storing charges only in the photoelectric conversion section, thus making it possible to obtain a high dynamic range. In addition, in a case of transferring the charges stored in the photoelectric conversion section of each of the pixels all at once to the charge-holding section, it is possible to reduce subject distortion. Hence, it is possible to switch, depending on purposes, between the mode of reducing the subject distortion and the mode of obtaining a high dynamic range.

This application claims the benefit of Japanese Priority Patent Application JP2018-167737 filed with the Japan Patent Office on Sep. 7, 2018, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

What is claimed is:

1. A solid-state imaging device comprising:
a light-receiving surface; and
a plurality of pixels arranged to face the light-receiving surface,
each of the plurality of pixels including:
a photoelectric conversion section that photoelectrically converts light incident via the light-receiving surface;
a charge-holding section that holds charges transferred from the photoelectric conversion section;
a first potential barrier provided between the photoelectric conversion section and the charge-holding section, wherein the first potential barrier is formed by a p-type region and an n-type region, and wherein the p-type region of the first potential barrier has a lower concentration of p-type impurities than surrounding p-type regions; and
a second potential barrier provided around a region including the photoelectric conversion section, the charge-holding section, and a first impurity semiconductor region, the first potential barrier being lower than the second potential barrier.

2. The solid-state imaging device according to claim 1, wherein the first potential barrier is formed by the first impurity semiconductor region, wherein the second potential barrier is formed by a second impurity semiconductor region, and wherein an impurity concentration of the first impurity semiconductor region is lower than an impurity concentration of the second impurity semiconductor region.

3. The solid-state imaging device according to claim 1, wherein each of the plurality of pixels further includes:
a first transfer transistor that controls a potential of the charge-holding section;
a second transfer transistor that transfers the charges held in the charge-holding section to a floating diffusion; and
a control section that controls the first transfer transistor and the second transfer transistor, wherein the control section controls a height of the first potential barrier in accordance with an imaging mode.

4. The solid-state imaging device according to claim 3, wherein, in a first imaging mode, the control section causes the photoelectric conversion section and the charge-holding section to store the charges in a state where the first potential barrier is kept lower than the second potential barrier, and thereafter turns ON the first transfer transistor and the second transfer transistor to transfer the charges stored in the photoelectric conversion section and the charge-holding section to the floating diffusion.

5. The solid-state imaging device according to claim 4, wherein, in a second imaging mode, the control section causes the charge-holding section of all of the plurality of pixels to store the charges in a state where a difference between the height of the first potential barrier and a height of the second potential barrier is narrowed, and thereafter turns ON the second transfer transistor to transfer the charges stored in the charge-holding section to the floating diffusion.

6. The solid-state imaging device according to claim 5, wherein, in the second imaging mode, the control section applies a negative bias to a gate of the first transfer transistor to narrow the difference between the height of the first potential barrier and the height of the second potential barrier.

7. The solid-state imaging device according to claim 5, wherein each of the plurality of pixels further includes a control transistor that controls the height of the first potential barrier, and wherein the control section applies a negative bias to a gate of the control transistor in the second imaging mode to narrow the difference between the height of the first potential barrier and the height of the second potential barrier.

8. An electronic apparatus comprising:
a solid-state imaging device that outputs image data corresponding to incident light; and
a signal processing circuit that processes the image data, the solid-state imaging device including:
a light-receiving surface; and
a plurality of pixels arranged to face the light-receiving surface,
each of the plurality of pixels including:
a photoelectric conversion section that photoelectrically converts the incident light via the light-receiving surface;
a charge-holding section that holds charges transferred from the photoelectric conversion section;
a first potential barrier provided between the photoelectric conversion section and the charge-holding section, wherein the first potential barrier is formed by a p-type region and an n-type region, and wherein the p-type region of the first potential barrier has a lower concentration of p-type impurities than surrounding p-type regions; and
a second potential barrier provided around a region including the photoelectric conversion section, the charge-holding section, and a first impurity semiconductor region, the first potential barrier being lower than the second potential barrier.

9. The electronic apparatus according to claim 8, further comprising:
an interface that allows a user to select one of a first imaging mode corresponding to a rolling shutter operation and a second imaging mode corresponding to a global shutter operation, wherein the solid-state imaging device executes one of an operation corresponding to the first imaging mode and an operation corresponding to the second imaging mode in accordance with the selection by the user.

10. The electronic apparatus according to claim 8, further comprising:
a mode control unit that selects, on a basis of the image data, one of a first imaging mode corresponding to a rolling shutter operation and a second imaging mode corresponding to a global shutter operation to instruct the solid-state imaging device to execute an operation corresponding to the selected imaging mode, wherein the solid-state imaging device executes the operation corresponding to the selected imaging mode in accordance with the instruction by the mode control unit.

* * * * *